US012660643B2

(12) United States Patent
Tang et al.

(10) Patent No.: US 12,660,643 B2
(45) Date of Patent: Jun. 16, 2026

(54) INTERDIGITAL CAPACITOR

(71) Applicant: TEXAS INSTRUMENTS INCORPORATED, Dallas, TX (US)

(72) Inventors: Yiqi Tang, Allen, TX (US); Rajen Manicon Murugan, Dallas, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 594 days.

(21) Appl. No.: 17/838,797

(22) Filed: Jun. 13, 2022

(65) Prior Publication Data

US 2023/0402356 A1 Dec. 14, 2023

(51) Int. Cl.
| | |
|---|---|
| *H10W 70/40* | (2026.01) |
| *H10W 20/20* | (2026.01) |
| *H10W 70/04* | (2026.01) |

(52) U.S. Cl.
CPC ......... *H10W 70/475* (2026.01); *H10W 20/20* (2026.01); *H10W 70/04* (2026.01); *H10W 70/424* (2026.01); *H10W 70/458* (2026.01)

(58) Field of Classification Search
CPC ........... H01L 23/49589; H01L 23/5223; H01L 23/495; H01L 23/498; H01L 23/49541; H01L 23/49558; H01L 23/49579; H01L 23/49861; H01L 23/3121; H01L 2221/68359; H01L 2924/1306; H01L 27/0218; H01L 27/0629; H01L 27/0605; H01L 27/10; H01L 28/60; H01L 28/40; H01L 28/88; H01L 28/90; H01L 28/92; H01L 29/122; H01L 29/127; H01L 29/15; H01L 29/158; H01L 29/2003; H01L 29/66462; H01L 29/66431; H01L 29/778; H01L 29/7789; H01L 29/7781; H01L 25/0655; H01L 25/072; H01L 21/4821; H01L 21/6835; H01L 21/8252; H01L 23/481; H01L 23/49548; H01L 23/49586; H01L 29/7783; H01L 29/78681; H01L 29/92; H01L 29/93; H05K 5/13; H10D 1/60–716; H10D 1/692; H10W 20/20; H10W 20/2125; H10W 20/222; H10W 20/233; H10W 20/42; H10W 20/496;

(Continued)

(56) References Cited

U.S. PATENT DOCUMENTS

| | | | | |
|---|---|---|---|---|
| 5,600,175 | A * | 2/1997 | Orthmann | H05K 1/184 257/532 |
| 6,265,764 | B1 * | 7/2001 | Kinsman | H01L 23/49589 257/676 |

(Continued)

*Primary Examiner* — Natalia A Gondarenko
(74) *Attorney, Agent, or Firm* — Xiaotun Qiu; Frank D. Cimino

(57) ABSTRACT

A routable lead frame (RLF) substrate has a conductive layer having first- and second-side traces having first fingers and second fingers, respectively, which are interdigitated with each other. A via layer is over the conductive layer. A first-side conductive via of the via layer is conductively coupled to the first-side trace. A second-side conductive via of the via layer is conductively coupled to the second-side trace. Dielectric molding material is disposed between the interdigitated fingers of the conductive layer and between the first-side conductive via and the second-side conductive via. The fingers and vias form an interdigital capacitor (IDC) useful in impedance matching and filtering.

15 Claims, 27 Drawing Sheets

(58) Field of Classification Search
CPC . H10W 70/04; H10W 70/424; H10W 70/458; H10W 70/475; H10W 70/479; H10W 70/63; H10W 70/65; H10W 70/654; H10W 74/10; H10W 74/114; H10W 70/60; H10W 70/611; H10W 70/614; H10W 70/616; H10W 70/618; H10W 70/62; H10W 70/635; H10W 70/641; H10W 70/644; H10W 70/652; H10W 70/6523; H10W 70/6525; H10W 70/6528; H10W 70/655; H10W 70/656; H10W 70/6565; H10W 70/657; H10W 70/658; H10W 70/66; H10W 70/662; H10W 70/664; H10W 70/666; H10W 70/668; H10W 70/67; H10W 70/68; H10W 70/681; H10W 70/682; H10W 70/685; H10W 70/686; H10W 70/687; H10W 70/69; H10W 70/692; H10W 70/695; H10W 70/698; H10W 70/699; H10P 72/74; H10P 72/743

USPC .... 257/76, 77, 499, 531, 528, 532; 438/250, 438/381, 393, 626–641
See application file for complete search history.

(56) References Cited

U.S. PATENT DOCUMENTS

| | | | | |
|---|---|---|---|---|
| 6,828,662 | B2 * | 12/2004 | Sekiguchi | H01L 23/49589 |
| | | | | 257/676 |
| 8,601,430 | B1 * | 12/2013 | Shroff | H10D 1/043 |
| | | | | 716/137 |
| 10,777,636 | B1 * | 9/2020 | Paul | H01L 23/5223 |
| 2007/0228506 | A1 * | 10/2007 | Min | H01L 28/60 |
| | | | | 361/306.3 |
| 2010/0090308 | A1 * | 4/2010 | Sardana | H10D 1/714 |
| | | | | 257/532 |
| 2019/0051597 | A1 * | 2/2019 | Kim | H10D 1/043 |
| 2020/0076031 | A1 * | 3/2020 | Nam | H01P 1/20381 |

* cited by examiner

602

602

606

606

610

614

610

614

804

ABS_Q [C/m^2]
0.00000057
0.00000053
0.00000049
0.00000045
0.00000041
0.00000037
0.00000033
0.00000029
0.00000025
0.00000021
0.00000017
0.00000013
0.00000009
0.00000005
0.00000001

806

1002

1006

1004

1006

RLF
SUBSTRATE

1014

1018

1016

1018

RLF QFN

1300

1400

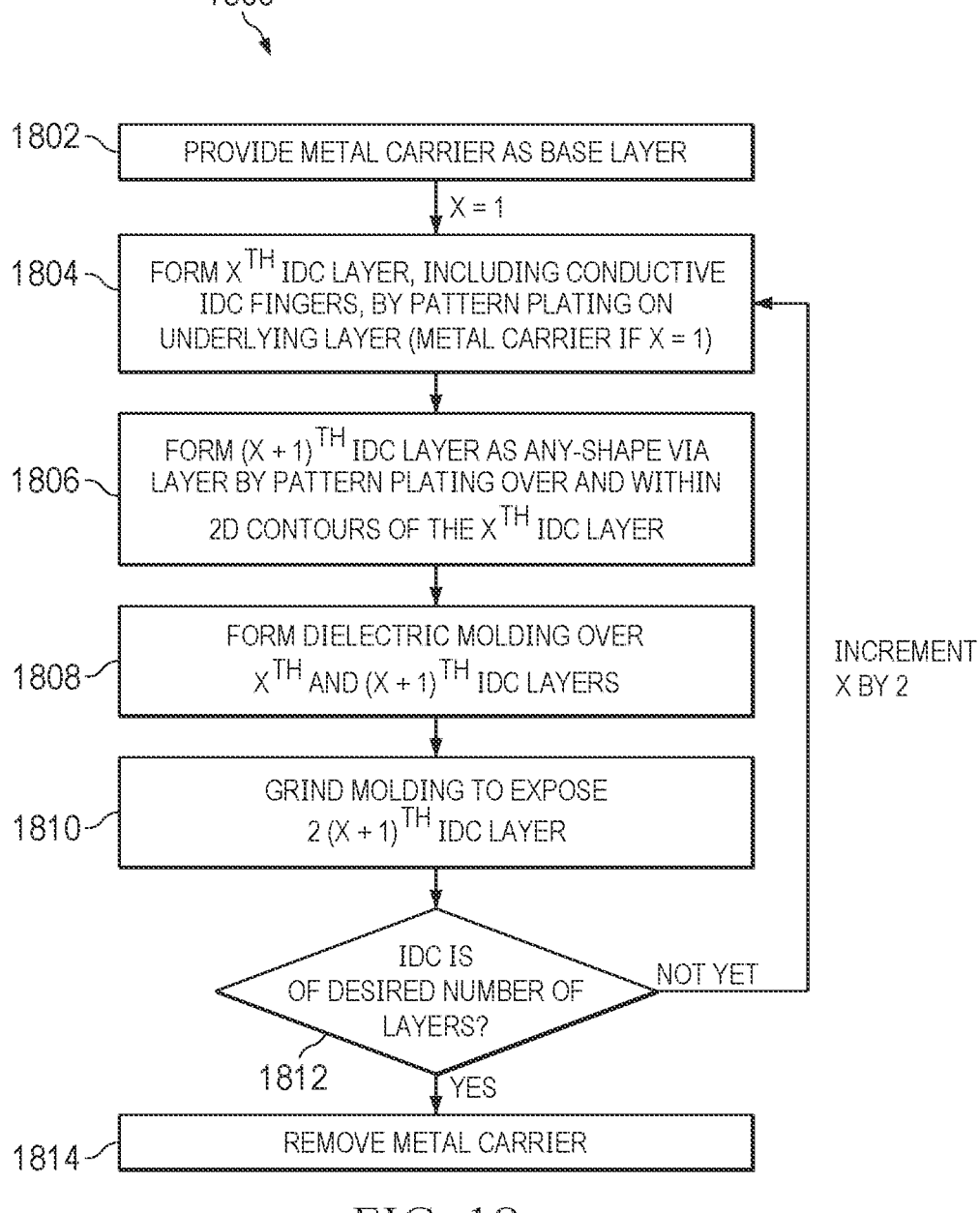

1800

1802 — PROVIDE METAL CARRIER AS BASE LAYER

X = 1

1804 — FORM X$^{TH}$ IDC LAYER, INCLUDING CONDUCTIVE IDC FINGERS, BY PATTERN PLATING ON UNDERLYING LAYER (METAL CARRIER IF X = 1)

1806 — FORM (X + 1)$^{TH}$ IDC LAYER AS ANY-SHAPE VIA LAYER BY PATTERN PLATING OVER AND WITHIN 2D CONTOURS OF THE X$^{TH}$ IDC LAYER

1808 — FORM DIELECTRIC MOLDING OVER X$^{TH}$ AND (X + 1)$^{TH}$ IDC LAYERS

1810 — GRIND MOLDING TO EXPOSE 2 (X + 1)$^{TH}$ IDC LAYER

INCREMENT X BY 2

1812 — IDC IS OF DESIRED NUMBER OF LAYERS?          NOT YET

YES

1814 — REMOVE METAL CARRIER

FIG. 18

INTERDIGITAL CAPACITOR

TECHNICAL FIELD

This description relates generally to electrical devices, and more particularly to an interdigital capacitor (IDC).

BACKGROUND

An interdigital (or interdigitated) capacitor (IDC) is a capacitor that includes two interlocking comb-shaped arrays of conductors that are separated in space by gaps that in some cases can be filled with a dielectric. The conductors of the respective arrays, which can be referred to as "fingers," provide coupling between input and output terminals across the gaps. The gaps between fingers and at the ends of the fingers can be the same distance. The performance of the IDC can be determined by these parameters and others, such as the length and width of the fingers, the thickness of the conductors, the resistivity of the conductors, and the height and dielectric constant of a substrate in which the conductors are mounted.

A lead frame is a structure inside an integrated circuit (IC) package that carries signals from an IC die inside the package to the outside of the package. A lead frame can include, for example, a central die pad, upon which the die is glued or soldered; bond pads, where bond wires are placed to connect the die to parts inside of the package and outside of the die; metal leads that connect the inside of the package with the outside; and mechanical connections to fix these parts inside a frame structure. The coupled die and lead frame can be molded in molding compound to form the completed IC package. Standard lead frames may have the metal leads on only a single layer. By contrast, a routable lead frame (RLF) is a lead frame that includes a multi-layer routable substrate, e.g., a molded interconnect substrate (MIS), on which the leads are formed by traces that are routed, e.g., under and/or over one another, through an etching process in which layers of the substrate are built up one at a time, providing higher density, reduction of package size, and improved thermal dissipation over earlier lead frame designs.

SUMMARY

An example routable lead frame (RLF) substrate includes a conductive layer having a first fingers in a first-side trace interdigitated with second fingers in a second-side trace. The RLF substrate further includes a via layer over the conductive layer. The via layer has a first-side conductive via conductively coupled to the first-side trace and a second-side conductive via conductively coupled to the second-side trace. The RLF substrate further includes dielectric molding material disposed between the interdigitated fingers of the conductive layer and between the first-side conductive via and the second-side conductive via. The first-side trace and the first-side conductive via are capacitively coupled to the second-side trace and the second-side conductive via through the dielectric molding material.

An example method of manufacturing an RLF substrate includes providing a metal carrier base layer and forming a first layer that includes interdigital capacitor IDC fingers on the metal carrier base layer. The first layer has two-dimensional contours. A second layer is formed as a via layer over the first layer and within the two-dimensional contours. Dielectric molding is formed over the first and second layers. Removing a portion of the dielectric molding exposes a surface of the second layer. The metal carrier base layer is thereafter removed.

An example packaged integrated circuit (IC) includes an RLF substrate, an IC die attached and conductively coupled to an upper surface of the RLF substrate, and a mold that encapsulates the IC die and the upper surface of the RLF substrate. The RLF substrate includes an IDC conductively coupled to the IC die.

3

Figure 16:
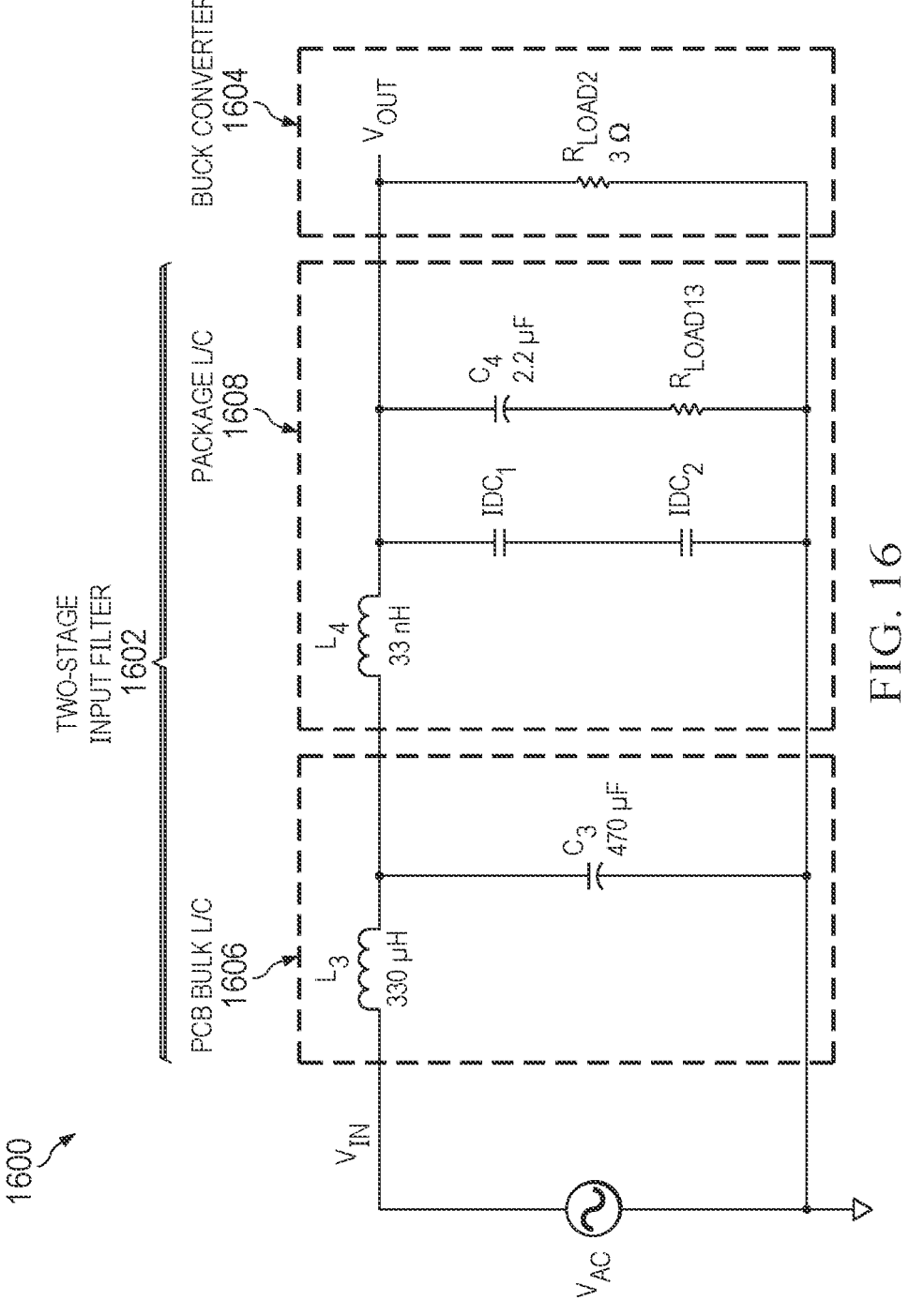

FIG. 16 is a circuit schematic of an example DC-to-DC converter input filter that includes one or more routable lead frame interdigital capacitors as part of its second-stage input filter circuitry.

Figure 17:
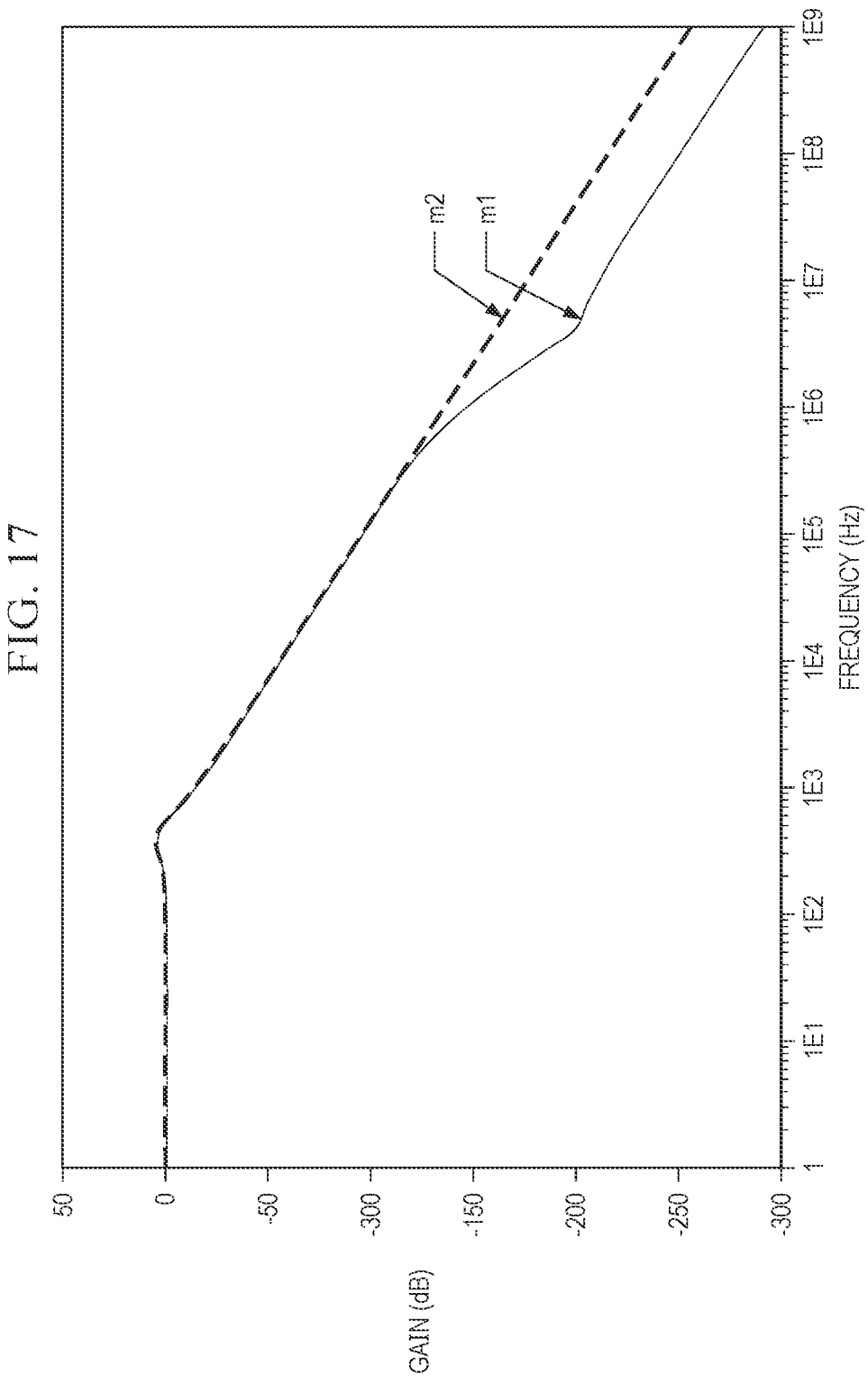

FIG. 17 is a graph of example frequency responses for an example DC-to-DC converter input filter that includes one or more routable lead frame interdigital capacitors as part of its second-stage input filter circuitry.

FIG. 18 is a flow chart of an example fabrication process for making an interdigital capacitor in a routable lead frame substrate.

DETAILED DESCRIPTION

An interdigital capacitor (IDC) can be fabricated using a routable lead frame (RLF) fabrication process. An RLF IDC can be fabricated as part of the packaging used to package one or more integrated circuit (IC) dies into a product that can be mounted, for example, to a printed circuit board (PCB) as part of a larger electronic system. In an RLF IDC, interdigital capacitive coupling can be provided even by one or more layers that are used as the equivalent of what in laminated substrate processes would be termed "via layers" that connect together other layers above and below them. The RLF process allows for "any-shape vias," wherein the shapes of the via layers are not limited to being circular or otherwise low-aspect-ratio when viewed in a top-down view. When shaped, for example, as walls, L-shapes, or combs, the via layers can provide additional capacitive coupling. Therefore, an IDC can be fabricated with higher performance, including higher capacitance and lower impedance, than single-layer IDCs or IDCs that are fabricated using methods other than the RLF fabrication process described herein. The RLF process further permits for fabrication of an IDC having an "elevated trace," which is a layer of electrically conductive material that extends above the top of the RLF substrate and further improves (increases) the capacitance of the IDC. A multi-coupled IDC fabricated using an RLF process can be used, for example, to provide enhanced impedance matching or filtering in electronic devices.

Figure 1:
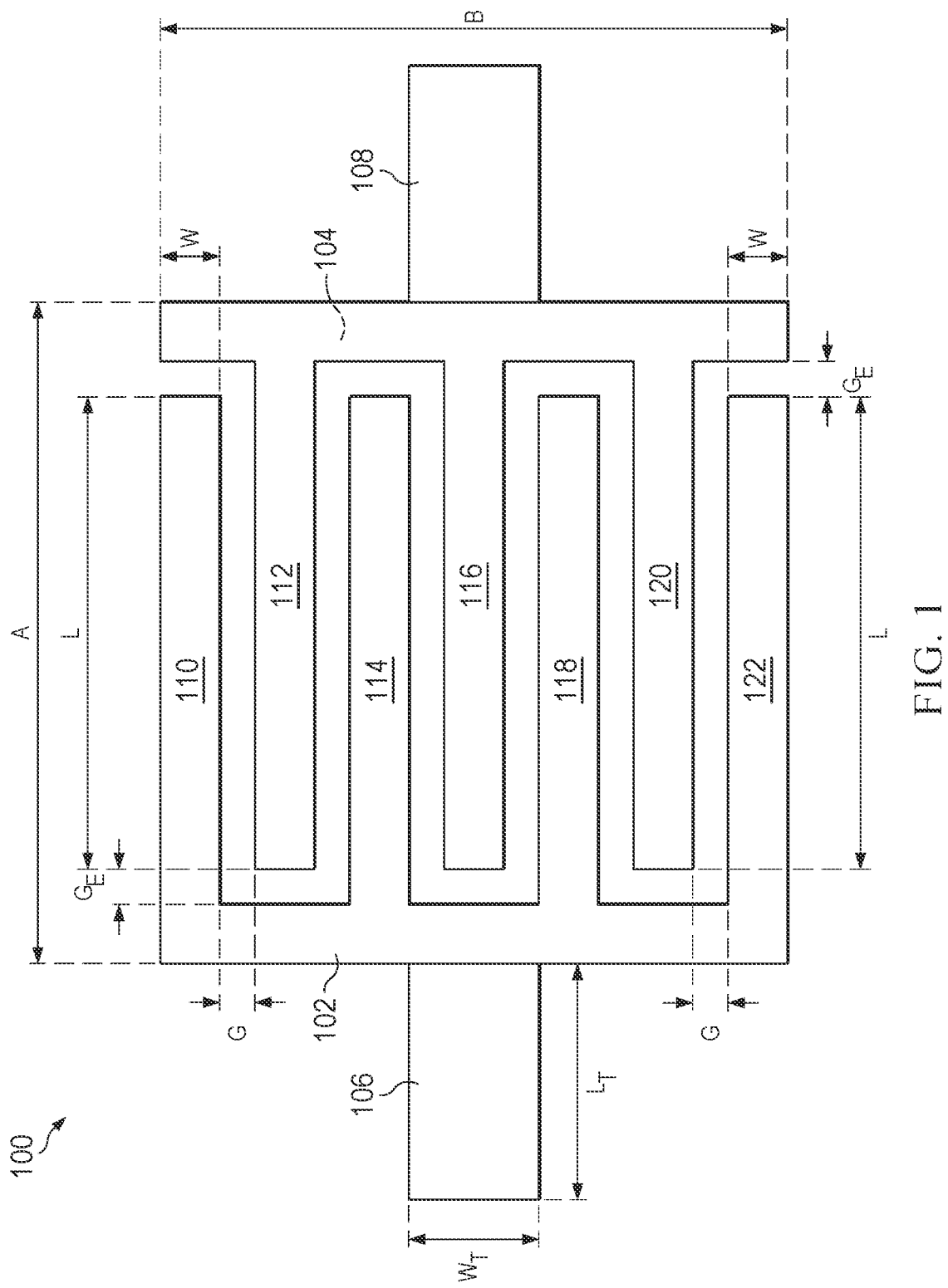
FIG. 1 is a top-down schematic view of an example interdigital capacitor or an example layer of an example multi-layer interdigital capacitor.

FIG. 1 shows an example interdigital capacitor layer 100. In single-layer interdigital capacitor examples, interdigital capacitor layer 100 can be a complete capacitor in itself, or, in multi-layer interdigital capacitor examples, the interdigital capacitor layer 100 can be a single layer of a multi-layer interdigital capacitor. The capacitor layer 100 includes a first side 102 that can be capacitively coupled to a second side 104. The capacitor layer 100 includes a number N of interdigitated conductive fingers 110, 112, 114, 116, 118, 120, 122. In some examples, the capacitor layer 100 can be formed using an RLF process as a layer of electrically conductive material, such as copper, aluminum, or gold. In the illustrated example, there are N=7 conductive fingers, but other examples can have more or fewer fingers (three or greater), the number N being a design parameter that can determine the operational properties of the capacitor, such as its capacitance. In the example of FIG. 1, the first side 102 has four fingers 110, 114, 118, 122 that are interdigitated with the three fingers 112, 116, 120 of the second side 104. Other numbers of respective fingers can be implemented in other examples. The fingers can be separated from each other by an interdigitation gap distance G and can be spaced at their ends from conductive material of an opposite side by end gap distance $G_E$. The fingers can be fabricated to have between them a substrate material having a dielectric constant $\varepsilon_r$.

4

The capacitor layer 100 can also have terminals 106, 108, in which a first terminal 106 is conductively coupled to the first side 102 and a second terminal 108 is conductively coupled to the second side 104. In some examples, the second terminal of a first instance of the capacitor layer 100 can be coupled to a first terminal of a second instance of the capacitor layer 100 to place two capacitors in series to provide a total capacitance that is less than any one of the individual capacitors' capacitances. Any number of instances of the capacitor layers 100 can be coupled in series with each other in this fashion to provide effectively smaller capacitance. In other examples, multiple instances of the capacitor layer 100, or series arrangements thereof, can be coupled in parallel with each other via terminals 106, 108 to provide capacitance that is the sum of the capacitances of the parallel-coupled capacitors or series arrangements of capacitors. In another example, a terminal can be coupled to a circuit ground or low-voltage rail to provide a shunt capacitor.

Terminals 106, 108 can have a length $L_T$ and a width $W_T$. Exclusive of terminals 106, 108, the capacitor can have a footprint of length A and width B. Each finger can have a width W and a length L. The finger gaps G and $G_E$, the finger width W, and the number of fingers N, among other parameters such as the height h of the substrate material, can be selected during a design phase to provide a capacitor having capacitance C according to the following equations, where the expressions for $A_1$ and $A_2$ are approximations obtained by curve fitting:

$$C = (\varepsilon_r + 1)L[(N-3)A_1 + A_2] \text{ (pF)}$$

$$A_1 = 4.409 \tanh\left[0.55\left(\frac{h}{W}\right)^{-0.45}\right] \times 10^{-6} \left(\frac{\text{pf}}{\mu\text{m}}\right)$$

$$A_2 = 9.92 \tanh\left[0.52\left(\frac{h}{W}\right)^{-0.5}\right] \times 10^{-6} \left(\frac{\text{pf}}{\mu\text{m}}\right)$$

Example dimensions for an example capacitor or capacitor layer are given in Table 1.

TABLE 1

| Example planar IDC dimensions. | |
| --- | --- |
| Description | Example dimension (μm) |
| Finger length (L) | 430 |
| Finger width (W) | 50 |
| Finger interdigitation gap (G) | 30 |
| Finger end gap ($G_E$) | 30 |
| Capacitor length (A) | 560 |
| Capacitor width (B) | 530 |
| Capacitor terminal length ($L_T$) | 200 |
| Capacitor terminal width ($W_T$) | 110 |

Figure 2:
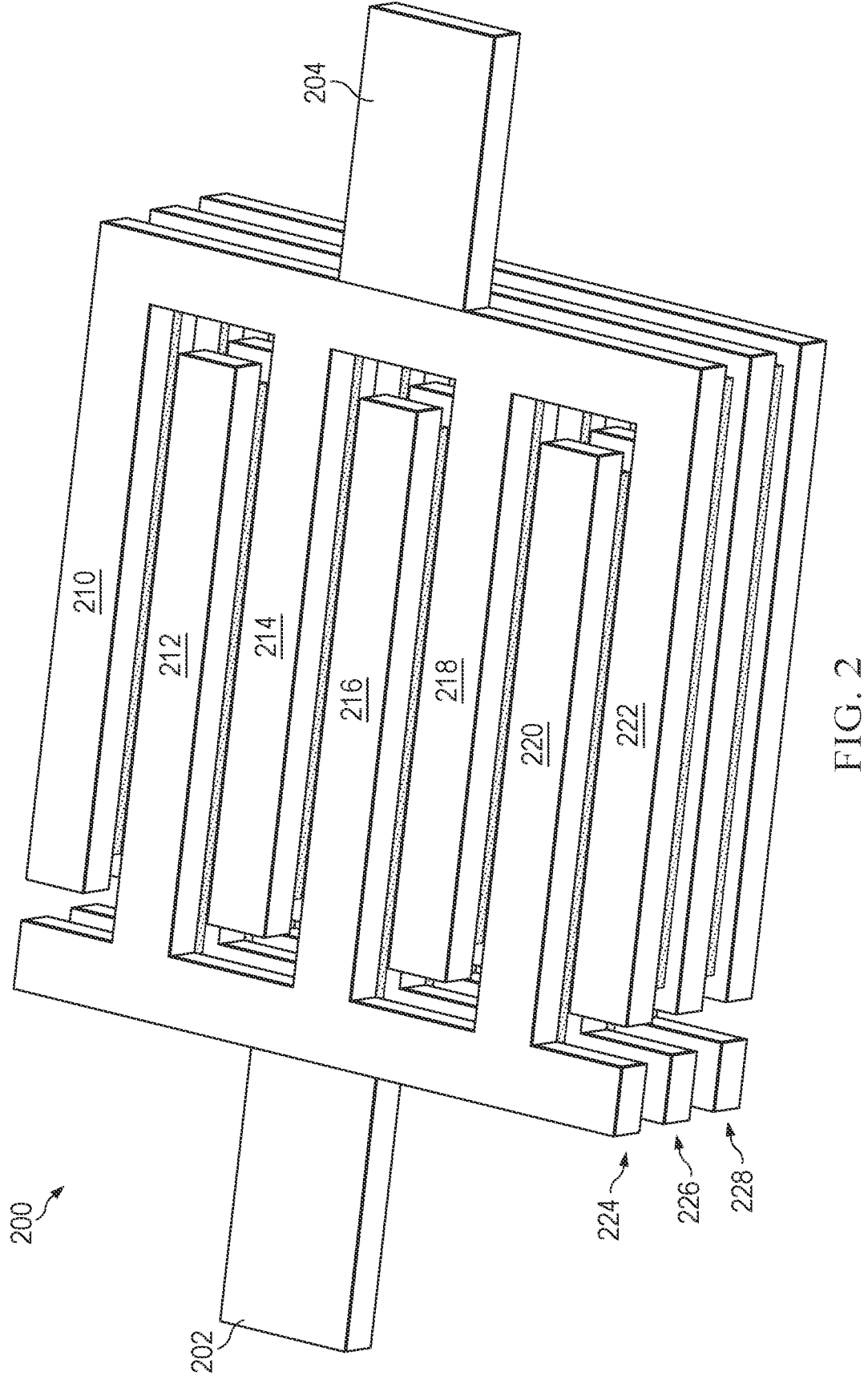
FIG. 2 is a parallel projection view of an example multi-layer interdigital capacitor.

FIG. 2 shows an example multi-layer interdigital capacitor 200 having three layers: a first layer 224, a second layer 226, and a third layer 228. First layer 224 can be implemented, for example, as an instance of capacitor layer 100 in FIG. 1. Second and third layers 226, 228 can also be implemented as instances of capacitor layer 100, omitting the terminals 106, 108. First layer 224 is provided with first and second terminals 202, 204 in the example of FIG. 2, corresponding to terminals 106, 108 in FIG. 1, but in other examples, not illustrated, the terminals can be provided on another one of the layers, or on multiple ones of the layers. As examples, the first terminal 202 can be provided on a different layer from the second terminal 204, or each of the layers can be provided with its own first and second terminals. The first and second layers 224, 226 can be conductively coupled to each other by a first conductive via layer (shown as layer 304 in FIG. 3). The second and third layers 226, 228 can be conductively coupled to each other by a second conductive via layer (shown as layer 308 in FIG. 3). The conductive via layers used to couple the respective capacitive layers can have any shape. In other examples (not illustrated, except as in FIGS. 6E through 6G and 9), the IDC 200 can have more or fewer layers than the three layers 224, 226, 228 illustrated in FIG. 2. IDC 200 has seven interdigitated fingers 210, 212, 214, 216, 218, 220, 222. In other examples (not illustrated), the IDC 200 can have more or fewer fingers (a minimum of three fingers).

In the illustrated example, a first-side terminal 202 is conductively coupled to three first-side fingers 212, 216, and 220, and a second-side terminal 204 is conductively coupled to four second-side fingers 210, 214, 218, 222. The repeated multi-layer structure of IDC 200 provides additional coupling, lower resistance, and overall better capacitive performance as compared to a single-layer IDC of the same footprint and two-dimensional geometry (as in FIG. 1). IDC 200 can be fabricated using an RLF process and therefore can include an elevated trace on the top of first layer 224 to provide even more capacitance. (Such an elevated trace is not shown in FIG. 1, but is shown, for example, as 614 in FIGS. 6E, 6F and 6G.) Such an elevated trace cannot be fabricated using previously existing routable substrate fabrication methods, such as laminated substrate fabrication methods.

Figure 3:
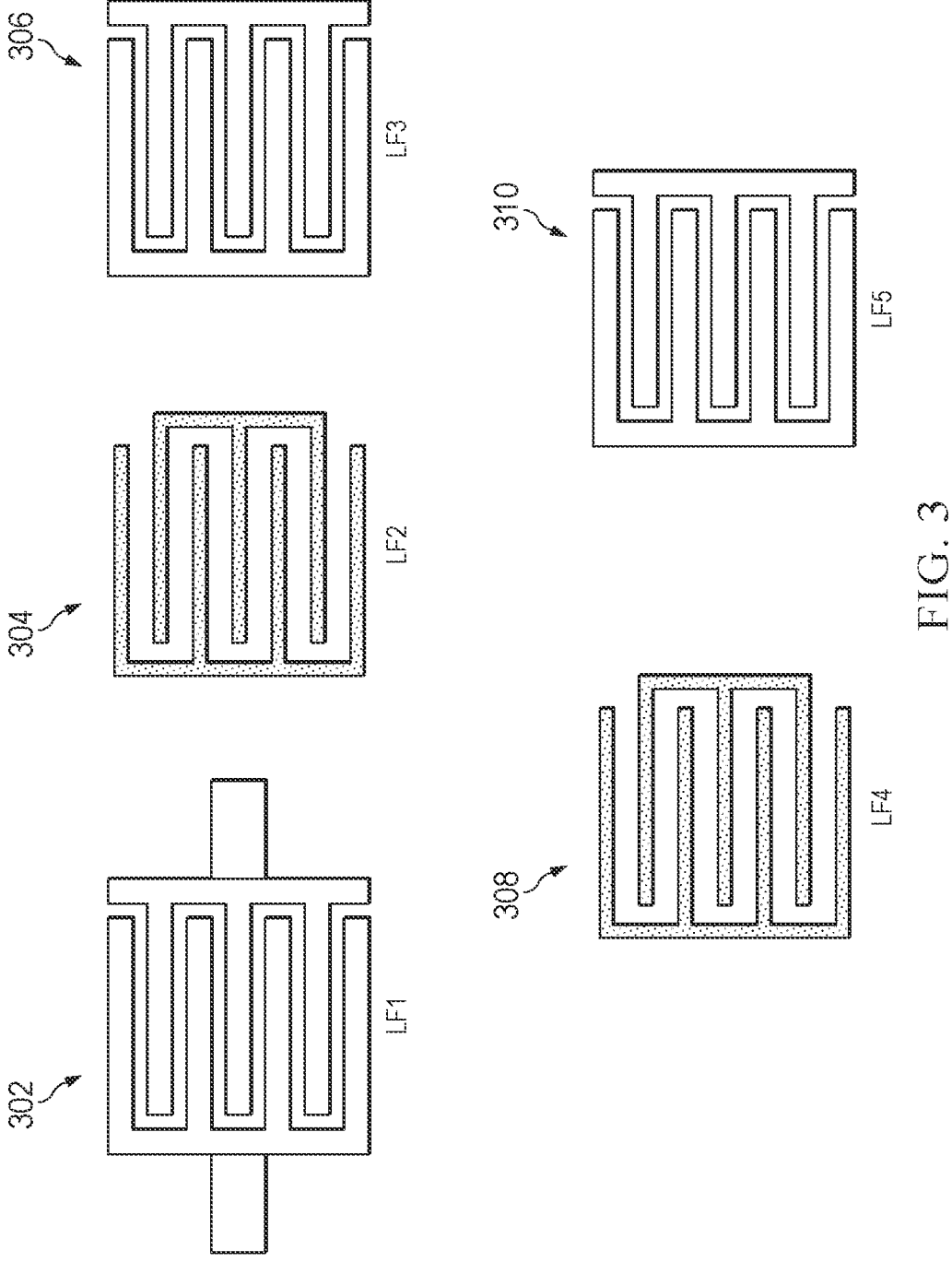
FIG. 3 is a layer diagram of different layers of an example multi-layer interdigital capacitor such as the one shown in FIG. 2.

FIG. 3 shows conductive (e.g., metal) portions of different layers 302, 304, 306, 308, 310 of an example multi-layer IDC, such as IDC 200 shown in FIG. 2. For example, layer LF1 302 can correspond to first layer 224 of FIG. 2, layer LF3 306 can correspond to second layer 226 of FIG. 2, and layer LF5 310 can correspond to third layer 228 of FIG. 2. LF1 302 is conductively coupled to LF3 306 by any-shape via layer LF2 304. LF3 306 is conductively coupled to LF5 310 by any-shape via layer LF4 308. Unlike in a laminated substrate, which may be limited to circular or otherwise low-aspect-ratio shapes for a via layer conductively coupling two other layers, the RLF process permits for via layers LF2 304, LF4 308 to be of any shape, such as the fingered-comb-shaped two-dimensional contours shown in FIG. 3. The two-dimensional contours of any-shape via layers LF2 304, LF4 308 shown in FIG. 3 are slightly thinner than the two-dimensional contours of LF1 302, LF3 306, and LF5 310, e.g., as a consequence of the RLF fabrication process and/or to avoid undesirable conductive overlap of layers that would short-circuit the IDC. The ability, in RLF methods, to provide any-shape via layers such as LF2 304 and LF4 308 provides more effective capacitive coupling than an array of circular or otherwise low-aspect-ratio vias, as may be required in a laminated substrate fabrication method. An RLF IDC can thereby provide higher capacitance than a similarly sized capacitor made using a laminated substrate fabrication method. Advantageously, via layers LF2 and LF4 contribute to the total capacitance of the multi-layer IDC of FIGS. 2 and 3. This is in contrast to the via layers of a multi-layer IDC produced using a laminated substrate process, in which the capacitive coupling of the via or array of vias will be less than the capacitive coupling provided by an any-shape via configured as a comb.

Fabricated together, adjacent to and conductively coupled with each other, the illustrated layers (including via layers) LF1 through LF5 in FIG. 3 form a capacitor that can be configured to be used in series or parallel with other capacitors or coupled to other components. In other examples, the capacitor can be configured as a shunt capacitor by providing an additional layer, LF6 (not illustrated), fabricated adjacent to and conductively coupled with LF5, having a conductive coupling to a circuit ground or a low-voltage rail made available, for example, from a PCB to which the RLF IDC can be attached. In still other examples, the metal portions of one or more of the via layers (LF2 and LF4 in the example FIG. 3) can be omitted such that different ones of the layers (LF1, LF3, LF5 in the example of FIG. 3) are insulated from each other by a dielectric layer between them, forming different capacitors on each layer that can be conductively coupled together in series to make a capacitor of lower effective capacitance. In any of these examples, the substrate that includes the IDC can further be fabricated with a layer having one or more surface-mount technology (SMT) studs that can be used for alignment and physical coupling with a PCB.

As an example, the two-dimensional feature dimensions of the IDC layers LF1 302, LF3 306, and LF5 310, as shown in FIG. 3, can be as described with reference to the example layer 100 of FIG. 1. For example, there can be a 30 micrometer gap between fingers that are each 50 micrometers in width to provide a capacitor having a two-dimensional footprint of 0.53 millimeters width and 0.56 millimeters length. Vertical-dimension thicknesses of each of the layers (including via layers) LF1 through LF5 (or LF6, if included) can be configured, within constraints of the RLF fabrication process, to provide an IDC in an RLF substrate of a desired total pre-mold thickness (e.g., between about 170 micrometers and about 230 micrometers) and having a desired number of layers. Example layer thicknesses of the layers (including via layers) LF1 through LF6 in the vertical dimension (the dimension not shown in FIG. 3) are given in Table 2. As an example, targeting the numbers of layers and the thicknesses of each of the layers to result in an about 200 micrometer pre-mold thickness can provide an RLF substrate including one or more IDCs that offers seamless integration into existing lead frame manufacturing flows.

TABLE 2

Example three-layer IDC thickness dimensions.

| | | | Example thicknesses (μm) | | |
|---|---|---|---|---|---|
| Index | Layer | Description | Minimum | Target | Maximum |
| 1.1 | LF1 | Trace1 etch back | 0 | — | 5 |
| 1.2 | LF1 | Trace1 thickness | 25 | 35 | 45 |
| 1.3 | LF2 | Via1 thickness | — | 35 | — |
| 1.4 | LF3 | Trace2 thickness | 25 | 35 | 45 |
| 1.5 | LF4 | Via2 thickness | — | 35 | — |
| 1.6 | LF5 | Trace3 thickness | 20 | 30 | 40 |
| 1.7 | LF6 | Via3 thickness | — | 30 | — |
| 1.8 | LF6 | Via3 etch back | 0 | 5 | 10 |
| 1.9 | | SMT stud | 15 | 30 | 45 |
| 1.10 | | Pre-mold thickness | 170 | 200 | 230 |

Figure 4A:
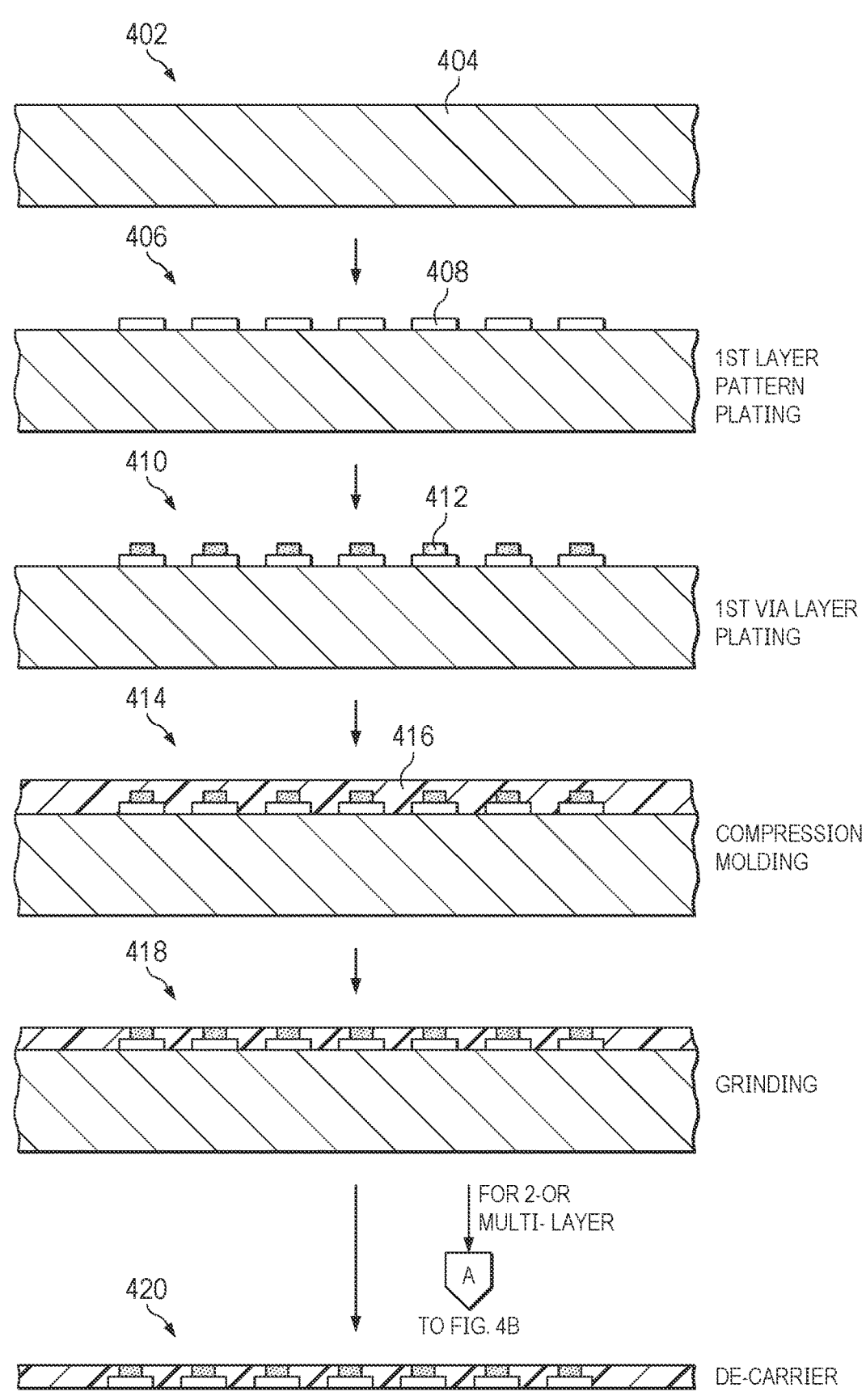
FIGS. 4A and 4B are diagrams of example manufacturing process flows for single-layer or multi-layer interdigital capacitor fabricated in a routable lead frame substrate.
Figure 4B:
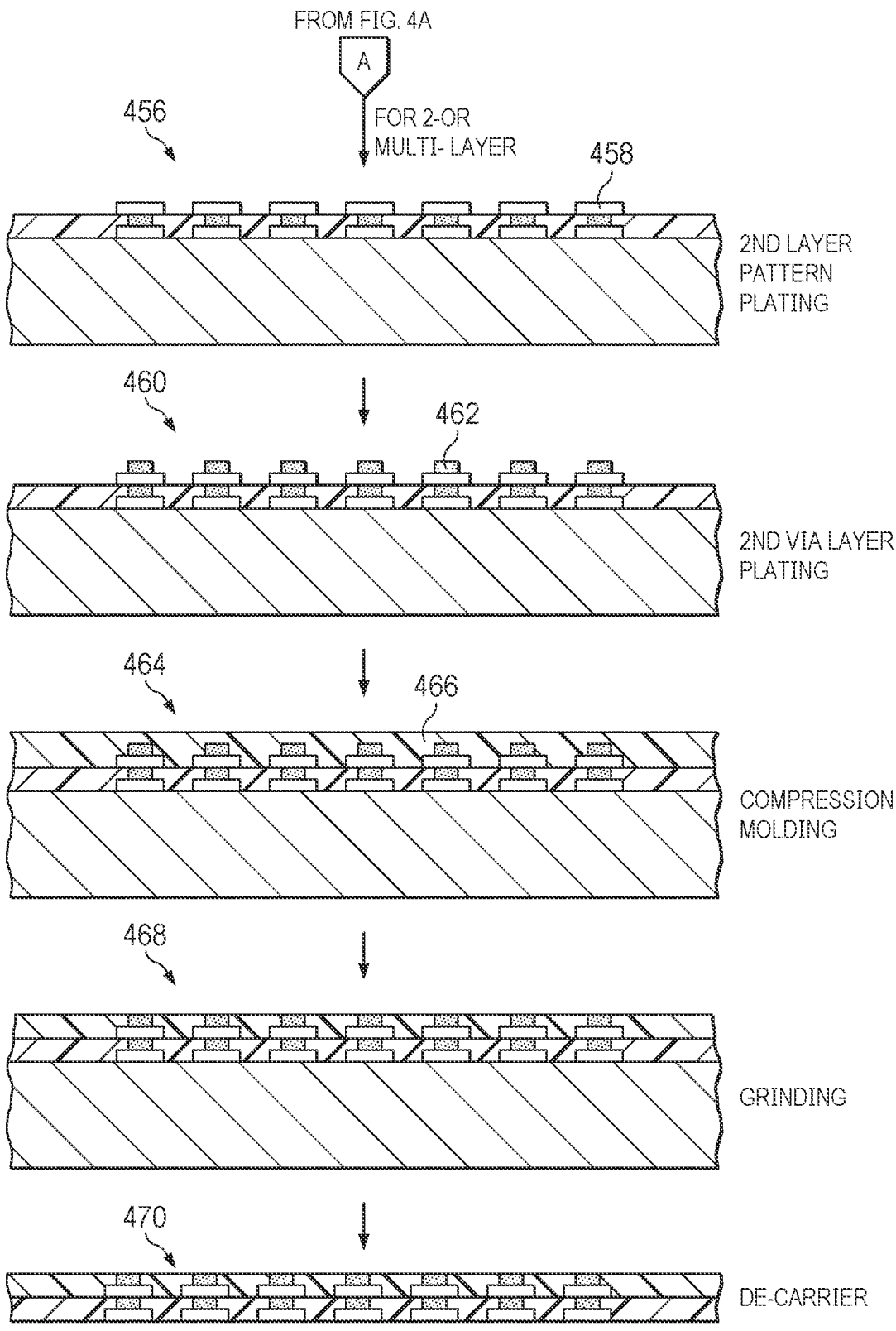

RLFs are produced with methods different from those used to produce conventional single-layer lead frames or multi-layer laminated substrates. FIGS. 4A and 4B show example manufacturing process flows for single-layer or multi-layer IDCs (e.g., IDC 100 or IDC 200) fabricated in an RLF substrate, illustrating the progressive formation of the structure of the IDC portion of the RLF in cross-section.

In FIG. 4A, cross-sections 402 and 406 show formation of a first patterned conductive layer 408 (e.g., of copper, aluminum, or gold) on a metal carrier 404 (e.g., of stainless steel). The metal carrier 404 serves as a base layer that is removed before the conclusion of the fabrication process. The first patterned conductive layer 408 can correspond to one of the layers 224, 226, 228 in FIG. 2 or to LF1 302, LF3 306, or LF5 310 in FIG. 3. The first patterned conductive layer 408 can include, for example, IDC fingers and/or terminals, such as described herein. The formation of the first patterned conductive layer 408 on the carrier 404 can include, for example, depositing a thin seed layer of the conductive material to be used for the patterned conductive layer 408, patterning and developing a first photoresist material layer (e.g., a photolithographic mask, not shown) on the carrier 404 to expose first openings in the first photoresist material layer, etching the seed layer to retain a patterned portion of the seed layer having the contour of the patterned conductive layer 408 (including, e.g., IDC fingers and/or terminals), stripping the first photoresist material layer over the retained patterned portion of the seed layer and forming (e.g., electroplating or depositing) additional conductive material on top of the retained patterned portion of the seed layer to effectively increase the thickness of the conductive material approximately within the contours of the retained patterned portion of the seed layer and thus result in the patterned conductive layer 408. The pattern of the first patterned conductive layer 408 can, for example, be formed to a thickness as given in Table 2 or Table 4.

Cross-section 410 shows formation of a first via layer 412 (e.g., of copper, aluminum, or gold) on, and wholly within the two-dimensional pattern contours of, the first patterned conductive layer 408. The first via layer 412 can correspond to one of LF2 304 or LF4 308 in FIG. 3. Like the first patterned conductive layer 408, the first via layer 412 is also a patterned conductive layer. First via layer 412 can be formed, for example, by patterning and developing a second photoresist material layer (not shown) on the carrier 404 and over portions of the first patterned metal layer 408 to expose second openings in the second photoresist material layer, and forming (e.g., electroplating or depositing) first via layer 412 on the first patterned conductive layer 408 in the second openings of the second photoresist material layer. The second photoresist material layer can then be stripped. The pattern of the first via layer 412 can, for example, be formed to a thickness, such as is given in Table 2 or Table 4. The two-dimensional contours of the pattern of the first via layer 412, as viewed in a top-down view orthogonal to the view of FIG. 4A, can have any shape that is within the bounds of the two-dimensional contours of the pattern of the first patterned conductive layer 408, and are not limited, for example, to a disjointed array of circular or small-aspect-ratio shapes. In some examples, the two-dimensional contours of the pattern of the first via layer 412 form one or more continuous wall, L, or comb shapes when viewed in a top-down view (orthogonal to the views of FIG. 4A). For example, the first via layer 412 can comprise a wall, L, or comb that is continuous for at least 100 micrometers, e.g., at least 300 micrometers, e.g., at least 500 micrometers.

Cross-sections 414 and 418 show the result of a first molding process, e.g., molding and grinding, that results in a first dielectric mold material 416 covering the first patterned conductive layer 408 and the first via layer 412 in a way that exposes surfaces of the first via layer 412. As an example, the first dielectric mold material 416 can be a build-up film such as Ajinomoto Build-up Film (ABF) interlayer insulating materials. As another example, the first dielectric mold material 416 can be a pre-preg material, which is a fiber weave or cloth (e.g., of glass fibers) pre-impregnated with a bonding agent (e.g., an epoxy or phenolic resin). As yet another example, the first dielectric mold material 416 can be an epoxy (e.g., a mold compound epoxy). In the molding of the first molding process, the result of which is shown in cross-section 414, a first dielectric layer 416 is formed over the first patterned conductive layer 408 and the first via layer 412. For example, the first dielectric layer 416 can be compression molded over the first patterned conductive layer 408 and the first via layer 412. The first dielectric layer 416 can be ground down to expose surfaces of the first via layer 412, the result of which is shown in cross-section 418.

Cross-section 420 shows the result of a de-carrier portion of the RLF fabrication process in which the carrier 404 is removed from the dielectric layer 416 and the conductive layers 408, 412, e.g., by dislodging the carrier 404 from the dielectric layer 416 and the conductive layers 408, 412 via a combination of a chemical etch process and a mechanical process. The conductive layers 408, 412 and the first dielectric layer 416 remain intact with each other and form a single-layer RLF IDC. As described below with regard to FIG. 10, an IC die 1012 can subsequently be attached to a surface of the first dielectric layer 416, where the die 1012 can include contacts on the surface of the die 1012 that is attached to the first dielectric layer 416. The contacts are aligned with and conductively coupled to exposed surfaces of the first via layer 412. A mold compound 1018 can then be formed over the die 1012, the first dielectric layer 416, the first patterned metal layer 408, and the first via layer 412 (but not over leads of the first patterned conductive layer 408, if any).

In other examples, a multi-layer IDC can be fabricated by substantially repeating the conductive layer formation, molding, and grinding steps as many times as desired before removing the carrier 404. Cross-sections 456, 460, 464, 468, and 470 in FIG. 4B illustrate a continuation of the example process of FIG. 4A to form a two-layer IDC. In other examples, a three-layer IDC, or an IDC with a greater number of layers, can be fabricated by repeating the same fabrication actions a number of times commensurate with the desired number of layers.

For example, cross-section 456 in FIG. 4B shows formation of a second patterned conductive layer 458 (e.g., of copper, aluminum, or gold) on the first via layer 412 and the first dielectric layer 416. The second patterned conductive layer 458 can correspond, for example, to layer 226 in FIG. 2 or to LF3 306 in FIG. 3. The second patterned conductive layer 458 can include, for example, IDC fingers and/or terminals. The formation of the second patterned conductive layer 458 on the first via layer 412 and the first dielectric layer 416 can, for example, include patterning and developing a third photoresist material layer (not shown) on the first dielectric layer 416 to expose third openings in the third photoresist material layer, forming (e.g., electroplating) a pattern (including, e.g., IDC fingers and/or terminals) on the first dielectric layer 416 in the third openings of the third photoresist material layer, and stripping the third photoresist material layer via a third etching process. The pattern of the second patterned conductive layer 458 can, for example, be formed to a thickness as given in Table 2 or Table 4.

Cross-section 460 shows depositing of a second via layer 462 (e.g., of copper, aluminum, or gold) on the second patterned conductive layer 458. The second via layer 462 can correspond to one of LF2 304 or LF4 308 in FIG. 3. The second via layer 462 is also a patterned conductive layer and can be formed similarly to first via layer 412. For example, a fourth photoresist material layer (not shown) can be patterned and developed on the first dielectric layer 416 and over portions of the second patterned metal layer 458 to expose fourth openings in the fourth photoresist material layer, and forming (e.g., electroplating or depositing) second via layer 462 on the second patterned conductive layer 458 in the fourth openings of the fourth photoresist material layer. The fourth photoresist material layer can then be stripped. The pattern of the second via layer 462 can, for example, be formed to a thickness, such as is given in Table 2 or Table 4. The two-dimensional contours of the pattern of the second via layer 462, as viewed in a top-down view orthogonal to the view of FIG. 4B, can have any shape that is within the bounds of the two-dimensional contours of the pattern of the second patterned conductive layer 458, and are not limited, for example, to a disjointed array of circular or small-aspect-ratio shapes. In some examples, the two-dimensional contours of the pattern of the second via layer 462 form one or more continuous wall, L, or comb shapes when viewed in a top-down view (orthogonal to the views of FIG. 4B). For example, the second via layer 462 can comprise a wall, L, or comb that is continuous for at least 100 micrometers, e.g., at least 300 micrometers, e.g., at least 500 micrometers.

Cross-sections 464 and 468 show the result of a second molding process, e.g., molding and grinding, that results in a second dielectric mold material 466 covering the second patterned conductive layer 458 and the second via layer 462 in a way that exposes surfaces of the second via layer 462. The second dielectric mold material 466 can be, for example, ABF, a pre-preg material, or an epoxy. In the molding of the second molding process, the result of which is shown in cross-section 464, a second dielectric layer 466 is formed over the second patterned conductive layer 458 and the second via layer 462. For example, the second dielectric layer 466 is compression molded over the second patterned conductive layer 458 and the second via layer 462. The second dielectric layer 466 can be ground down to expose surfaces of the second via layer 462, the result of which is shown in cross-section 468.

Cross-section 470 shows the result of a de-carrier portion of the RLF fabrication process in which the carrier 404 is removed from the dielectric layers 416, 466 and the conductive layers 408, 412, 458, 462, e.g., by dislodging the carrier 404 from the dielectric layers 416, 466 and the conductive layers 408, 412, 458, 462 via a combination of a chemical etch process and a mechanical process. The conductive layers 408, 412 and the first and second dielectric layers 416, 466 remain intact with each other and form, at this point, a two-layer RLF IDC. A three-layer IDC or an IDC with a greater number of layers can be fabricated by repeating the same fabrication actions more times than shown in FIG. 4 before concluding with a de-carrier.

A benefit of using an RLF fabrication process to make a multi-layer IDC, as compared to either a laminated substrate process or a ball-grid-array (BGA) process, is that the RLF fabrication process does not require formation of a plated through-hole (PTH) or a laser-drilled blind via. In an RLF fabrication process, the capacitive structural features of the IDC are built up layer-by-layer, with the advantage that the one or more via layers do not need to be circular or low-aspect-ratio in shape. The via layer(s) can be any continuous shape of conductive material, including rectangular, L-shaped, or a fingered comb shape (as shown). Any-shaped vias are not possible in a laser-drilled laminated substrate fabrication process or a conventional via process.

Figure 5:
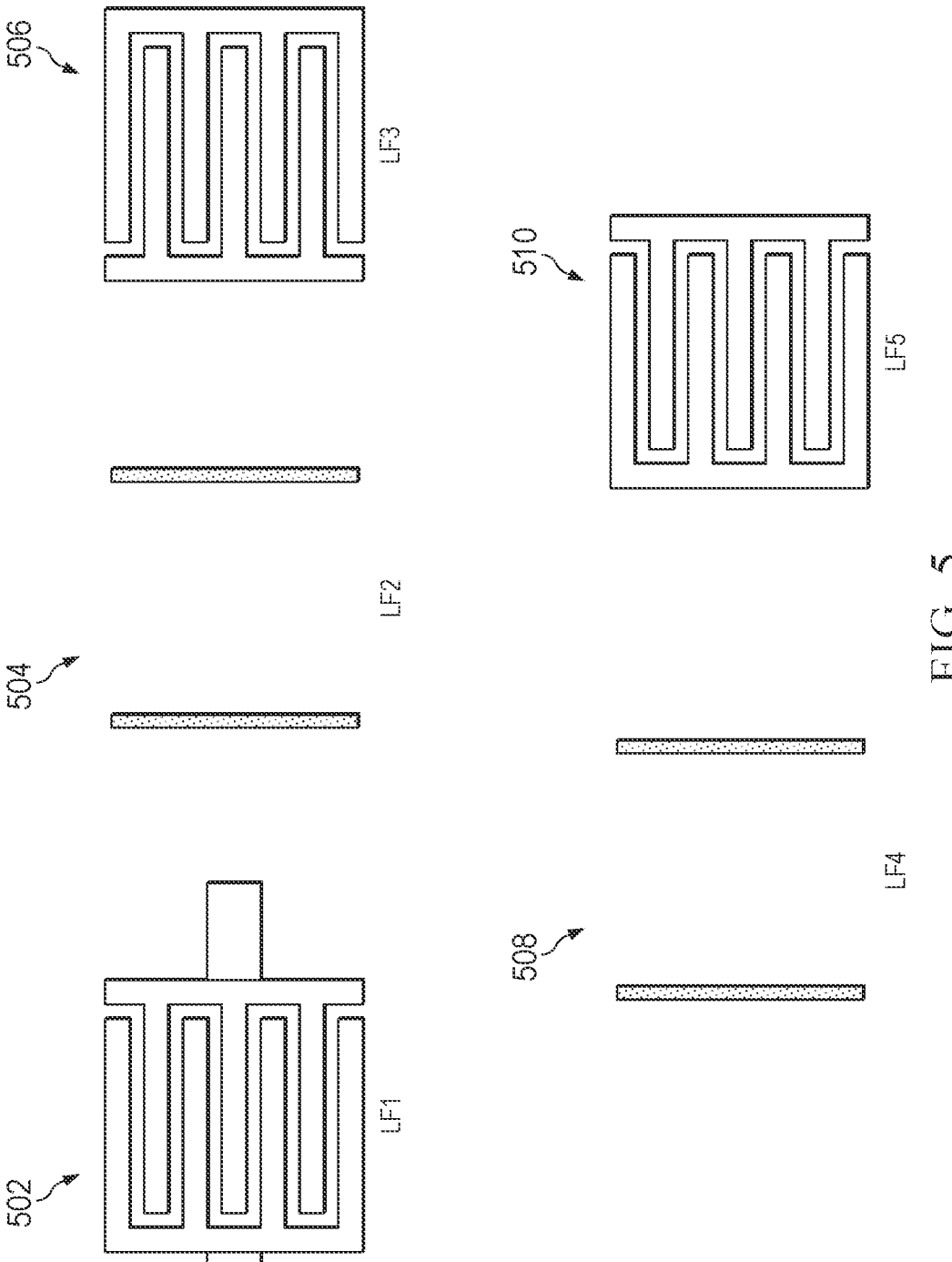
FIG. 5 is a layer diagram of different layers of an example multi-layer interdigital capacitor.

FIG. 5 shows different layers of another example multi-layer IDC. In the example of FIG. 5, the capacitive fingers are shown interdigitated in more than two spatial dimensions, including in the planar dimension and in a thickness dimension extending orthogonal relative to the different layers shown in FIG. 5. By contrast, in the example of FIG. 3, the fingers are shown interdigitated in only the planar dimension. For example, a finger of a first side of the IDC in layer LF1 502 is located directly above a finger of a second side of the IDC in layer LF3 506, as opposed to a finger of the first side of LF1 502 being directly above only a finger of the same first side in LF3 506. Similarly, a finger of the first side of the IDC in layer LF3 506 is located directly above a finger of the second side of the IDC in layer LF5 510, as opposed to a finger of the first side of LF3 506 being directly above only a finger of the same first side in LF5 510. The three-dimensional interdigitation provided by the RLF IDC design of FIG. 5 can provide a different capacitance value than the two-dimensional interdigitation provided by the RLF IDC design of FIG. 3. The capacitance provided by the RLF IDC layer design of FIG. 5 may be increased over the capacitance of the layer design of FIG. 3 by the three-dimensionality of the interdigitation of layers LF1 502, LF3 506, LF5 510. However, the capacitance provided by the RLF IDC layer design of FIG. 5 may be reduced more or less by the reduction in capacitive coupling provided by the via layers LF2 504 and LF4 508, which do not, in the example of FIG. 5, provide conductive coupling between same-side fingers of different layers, as the via layers LF2 304 and LF4 308 do in the RLF IDC design of FIG. 3. As with the design of FIG. 3, the design of FIG. 5 can be extended to more layers than are shown in the example of FIG. 5. Also as with the design of FIG. 3, an additional layer LF6 (not shown) can be configured either to provide a ground or low-voltage rail connection for a shunt capacitor configuration, or to provide an extended trace (e.g., like trace 614 in FIGS. 6E, 6F, and 6G) extended in the vertical dimension that is orthogonal to the plane dimensions shown in FIG. 5, that can increase the capacitance of the IDC still further. For clarity, illustration of dielectric molding is omitted from the layer views of FIGS. 3 and 5.

Figure 6A:
FIGS. 6A through 6F are diagrams comparing cross-sectional and parallel projection views of an example single-layer interdigital capacitor (FIGS. 6A and 6B), an example multi-layer interdigital capacitor (FIGS. 6C and 6D), and an example multi-layer interdigital capacitor with an elevated trace (FIGS. 6E and 6F).
Figure 6B:
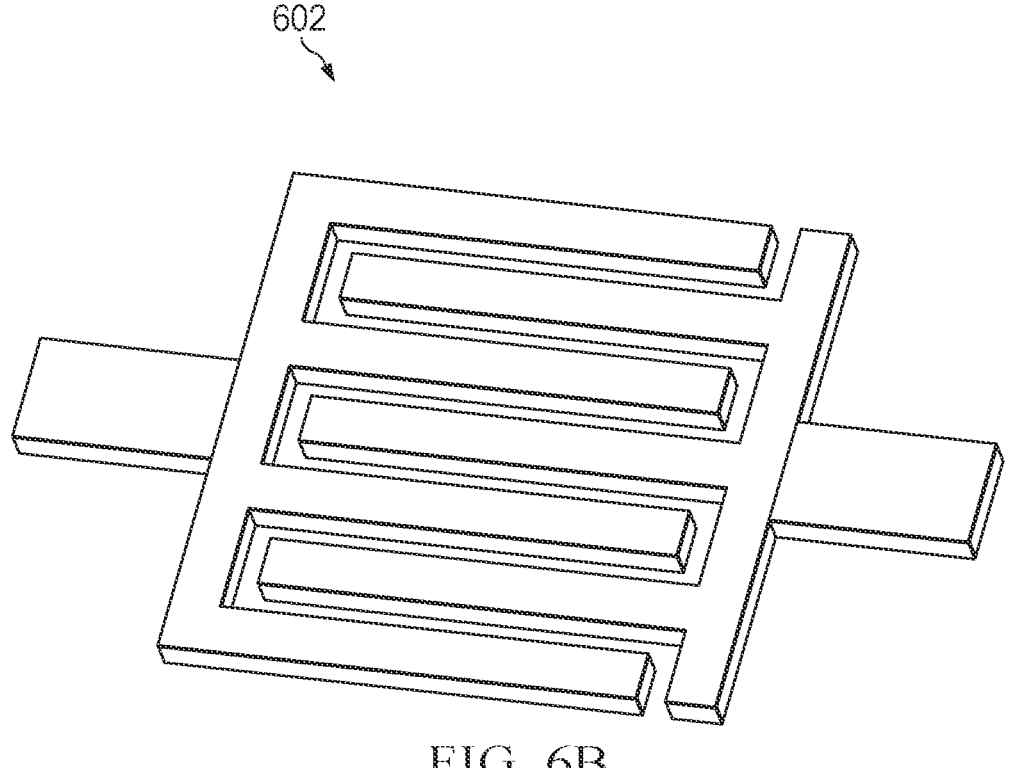
Figure 6C:
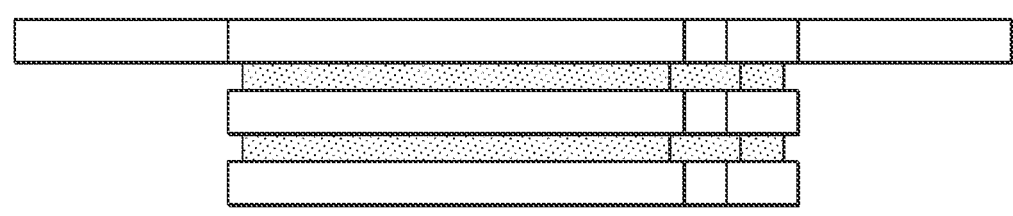
Figure 6D:
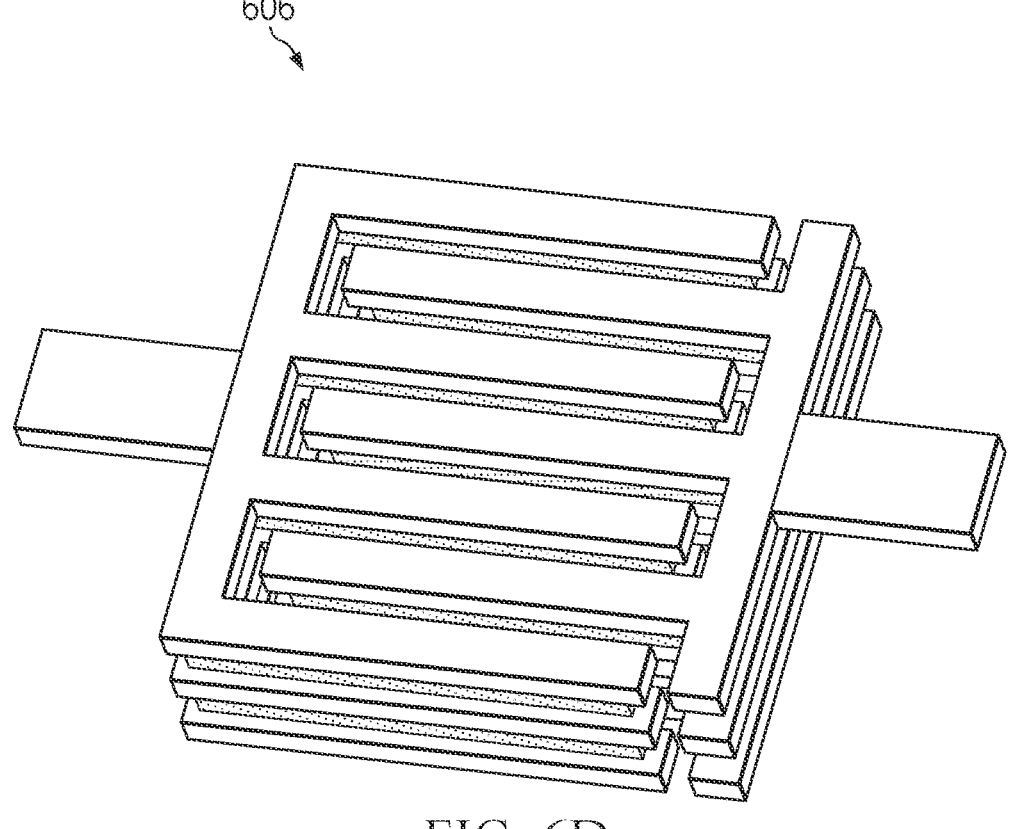
Figure 6E:
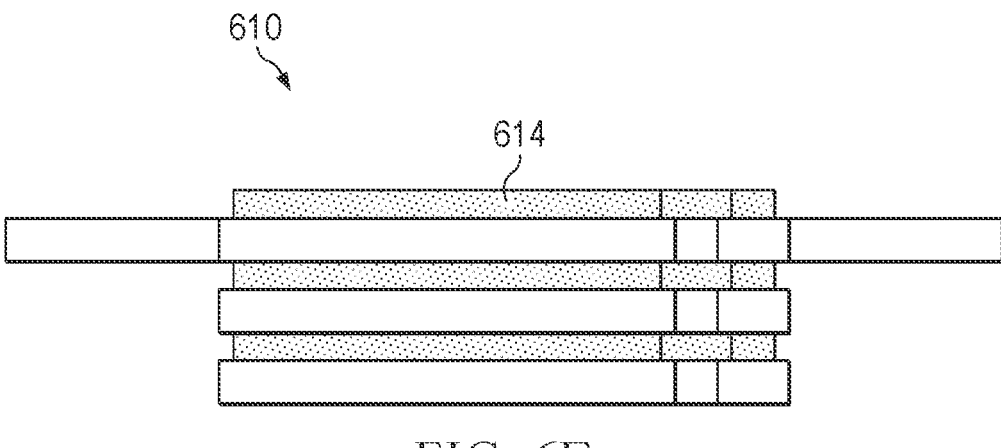
Figure 6F:
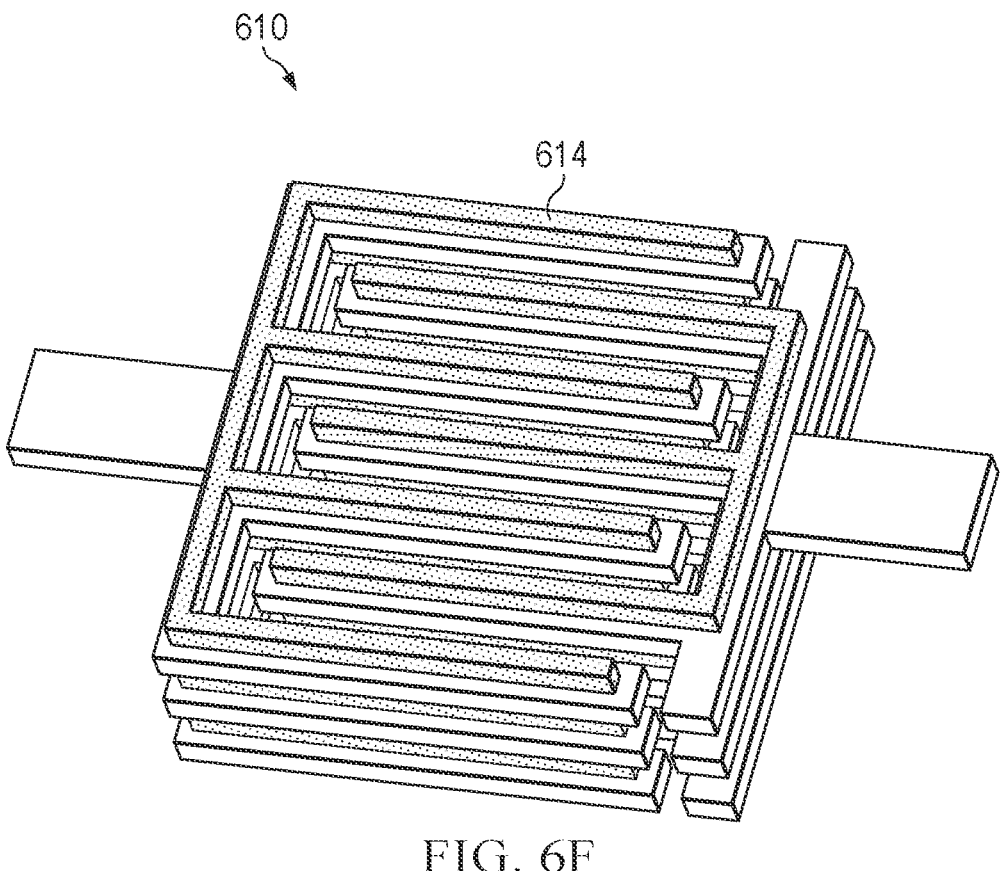

FIGS. 6A through 6F show cross-sectional views (FIGS. 6A, 6C, and 6E) and respective parallel projection views (FIGS. 6B, 6D, and 6F) for different example IDC configurations 602, 606, 610. FIGS. 6A and 6B show an example single-layer IDC 602. FIGS. 6C and 6D show an example multi-layer IDC 606. FIGS. 6E and 6F show an example multi-layer IDC 610 with an elevated trace 614. The single-layer IDC 602 of the views of FIGS. 6A and 6B is the same as that illustrated in FIG. 1. The multi-layer IDC 606 of the views of FIGS. 6C and 6D is the same as that illustrated in FIGS. 2 and 3. For clarity, illustration of dielectric molding is omitted from FIGS. 6A through 6G.

Table 3 compares example capacitance, equivalent series resistance (ESR), and equivalent series inductance (ESL) values for the three example IDCs 602, 606, 610 shown in FIGS. 6A through 6F. Table 3 demonstrates that a more than double capacitance value can be achieved within the same package area using a multi-layer IDC 606 of FIGS. 6C and 6D as compared to the single-layer IDC 602 of FIGS. 6A and 6B. Because minimization of package area leads to reduced fabrication cost and manufacture risk, increase of capacitance with a multi-layer IDC has advantages over increasing of capacitance by increasing the area of a single-layer IDC, or by placing multiple single-layer IDCs in parallel. The example multi-layer IDC also shows reduced ESR and ESL, demonstrating that the quality factor of the multi-layer IDC is improved over that of the single-layer IDC.

Figure 6G:
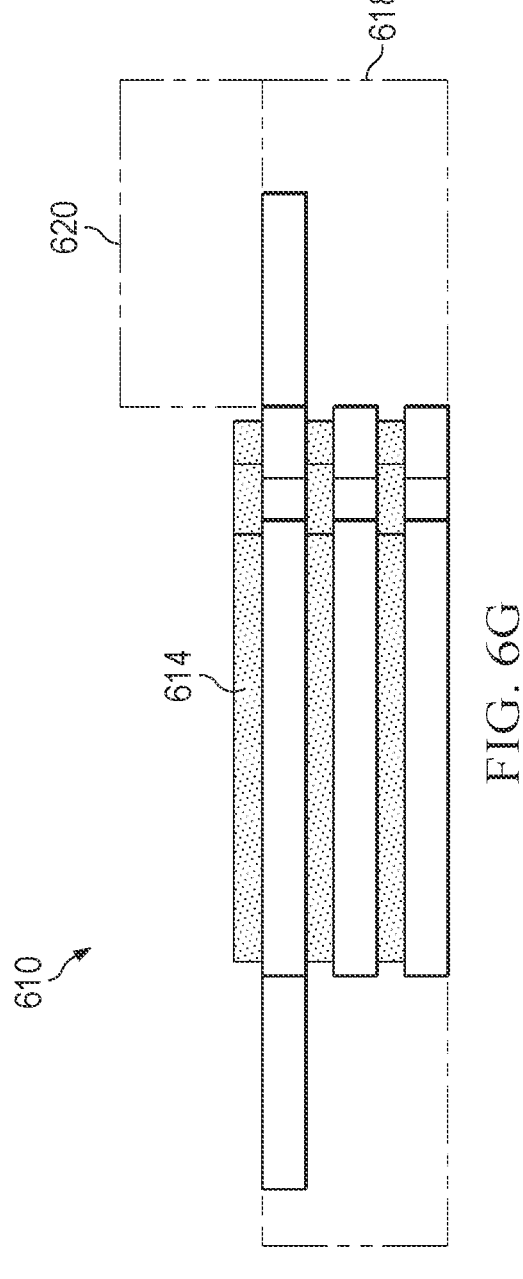
FIG. 6G is a cross-sectional diagram showing the example multi-layer interdigital capacitor with an elevated trace of FIG. 6E in relation to the RLF substrate and an IC die placement on the substrate.

Using an RLF fabrication process, the multi-layer IDC 606 of FIGS. 6C and 6D can be fabricated with the additional feature of an elevated trace 614 as shown in the multi-layer IDC 610 of FIGS. 6E and 6F. The feature of an elevated trace is available in an RLF fabrication process and not in a laminated substrate fabrication process. The elevated trace 614 adds additional plating of metal on top of the RLF substrate, within the same super-substrate planes where an IC die may later be placed. The view of FIG. 6G is the same as that of the view of FIG. 6E except that it also illustrates the relative positions of the RLF substrate 618, its elevated trace 614, and an IC die 620 in an example package. In a top-down view, or in a cross-sectional view such as the one shown in FIG. 6G, the elevated trace 614 is offset in two-dimensional placement position from the die 620 so as not to occupy the same three-dimensional space as the die 620 when the die 620 is attached to the substrate 618, even if the elevated trace 614 extends above a top surface of the substrate 618 to which the IC die 620 is attached. Provided that the eventual package fabrication plan allows for free space to a side of the location of the die 620, the lead frame substrate 618 can be built up with the elevated trace 614, e.g., of between about 30 micrometers and about 45 micrometers in thickness, that can further improve performance of the IDC by providing additional capacitive coupling without substantial added design or fabrication cost. The relative improved performance of an example multi-layer IDC with an elevated trace (as in the views of FIGS. 6E through 6G) over the example multi-layer IDC without an elevated trace (as in the views of FIGS. 6C and 6D) is given by the capacitance, ESR, and ESL values in the bottom line of Table 3.

TABLE 3

Example IDC performance values.

| | C (pF) | ESR (mΩ) | ESL (nH) |
|---|---|---|---|
| IDC-0 Hz | | | |
| Multi-layer RLF | 0.56 | 1.65 | 0.27 |
| Single-layer substrate | 0.23 | 2.45 | 0.29 |
| IDC-100 MHZ | | | |
| Multi-layer RLF | 0.54 | 5.85 | 0.24 |
| Single-layer substrate | 0.21 | 6.5 | 0.27 |
| IDC-0 MHZ | | | |
| Multi-layer RLF + elevated trace | 0.63 | 1.55 | 0.265 |

Figure 7:
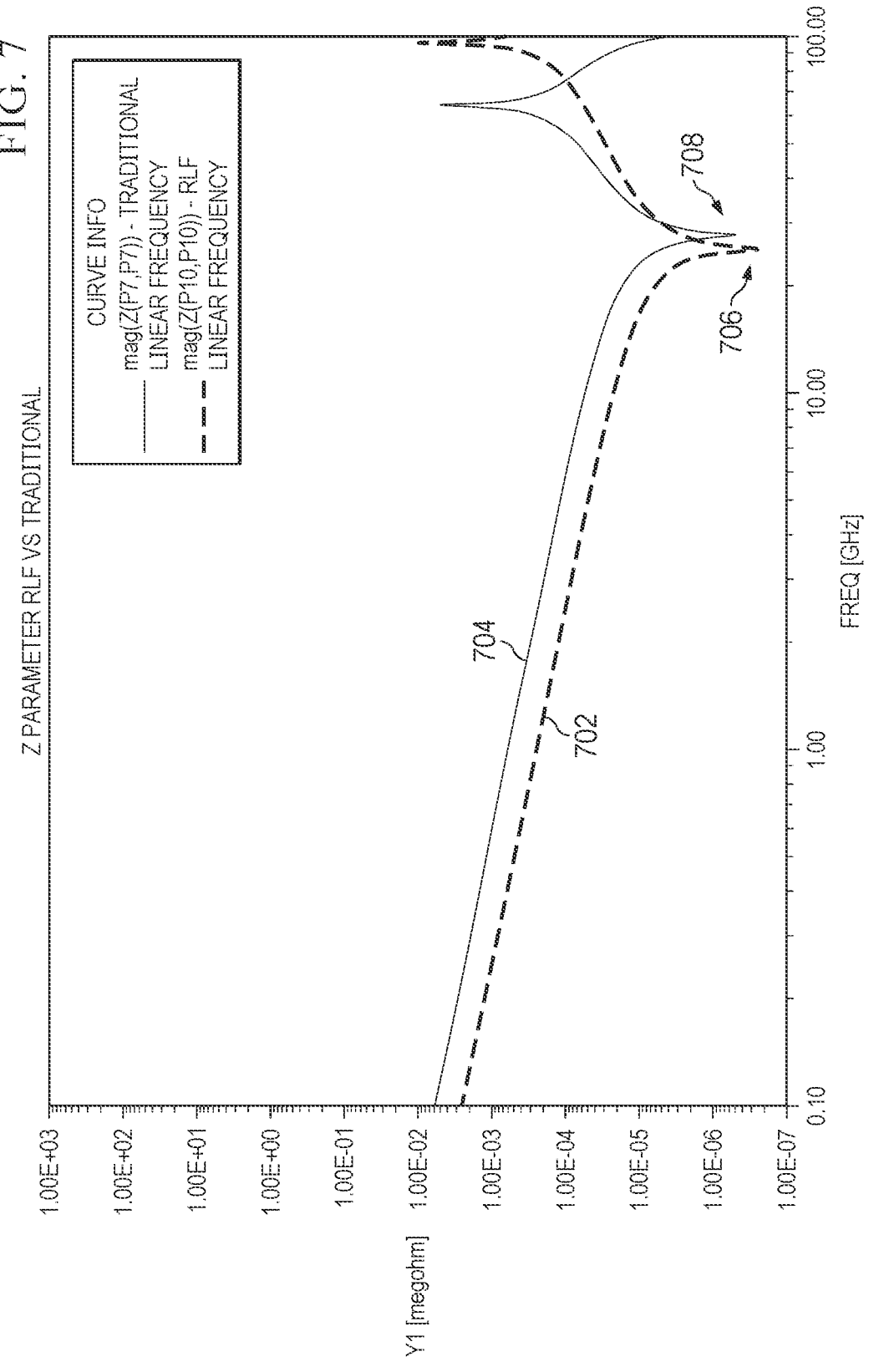
FIG. 7 is a frequency plot of impedances of an example multi-layer interdigital capacitor as compared to a single-layer interdigital capacitor.

FIG. 7 shows frequency plots 702 and 704 to compare the impedance of an example multi-layer IDC, such as that of FIGS. 2 and 3 with the impedance of a single-layer IDC, such as that of FIG. 1, over a frequency range. The graph of FIG. 7 is derived from simulations of the frequency responses of the respective multi-layer and single IDCs, defining the impedance Z of a capacitor as:

$$Z = \frac{1}{j\omega C} + R + j\omega L$$

where j is the square root of negative one, ω is the AC frequency, C is the capacitance of the capacitor, R is the resistance of the capacitor, and L is the inductance of the capacitor. At higher frequencies, the inductance term dominates. Plot 702 demonstrates that the multi-layer IDC simulated has a range of operation extending up to between about 60 gigahertz and about 70 gigahertz. Optimal points of operation at which the impedance is lowest are shown at 706 for the multi-layer IDC and at 708 for the single-layer IDC at between about 20 gigahertz and about 30 gigahertz, within the frequency range of operation of amplifiers and synthesizers in which the multi-layer IDCs described herein may be implemented. The total impedance 702 of the multi-layer IDC between about 100 megahertz and about 25 gigahertz is lower than the total impedance 704 of the single-layer IDC, as is indicative of the larger capacitance value of the multi-layer IDC. Impedance minimum 706 of the multi-layer IDC is at a slightly lower frequency than impedance minimum 708 of the single-layer IDC. FIG. 7 demonstrates overall improved performance of the multi-layer IDC in comparison to the single-layer IDC across most of the frequency range of interest.

Figure 8A:
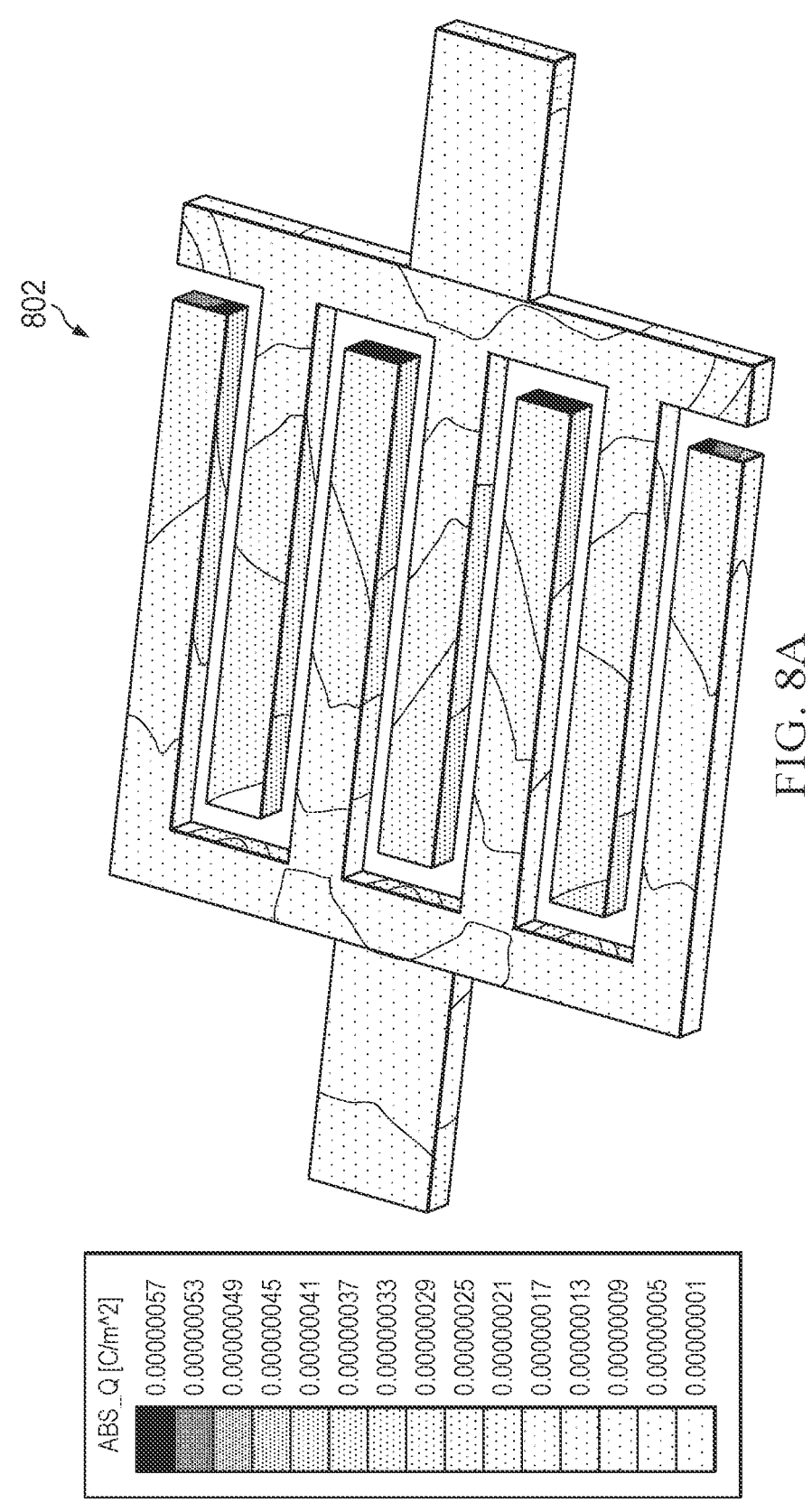
FIGS. 8A through 8D are diagrams comparing electric field heat maps and electric field vector maps of example single-layer and multi-layer interdigital capacitors.
Figure 8B:
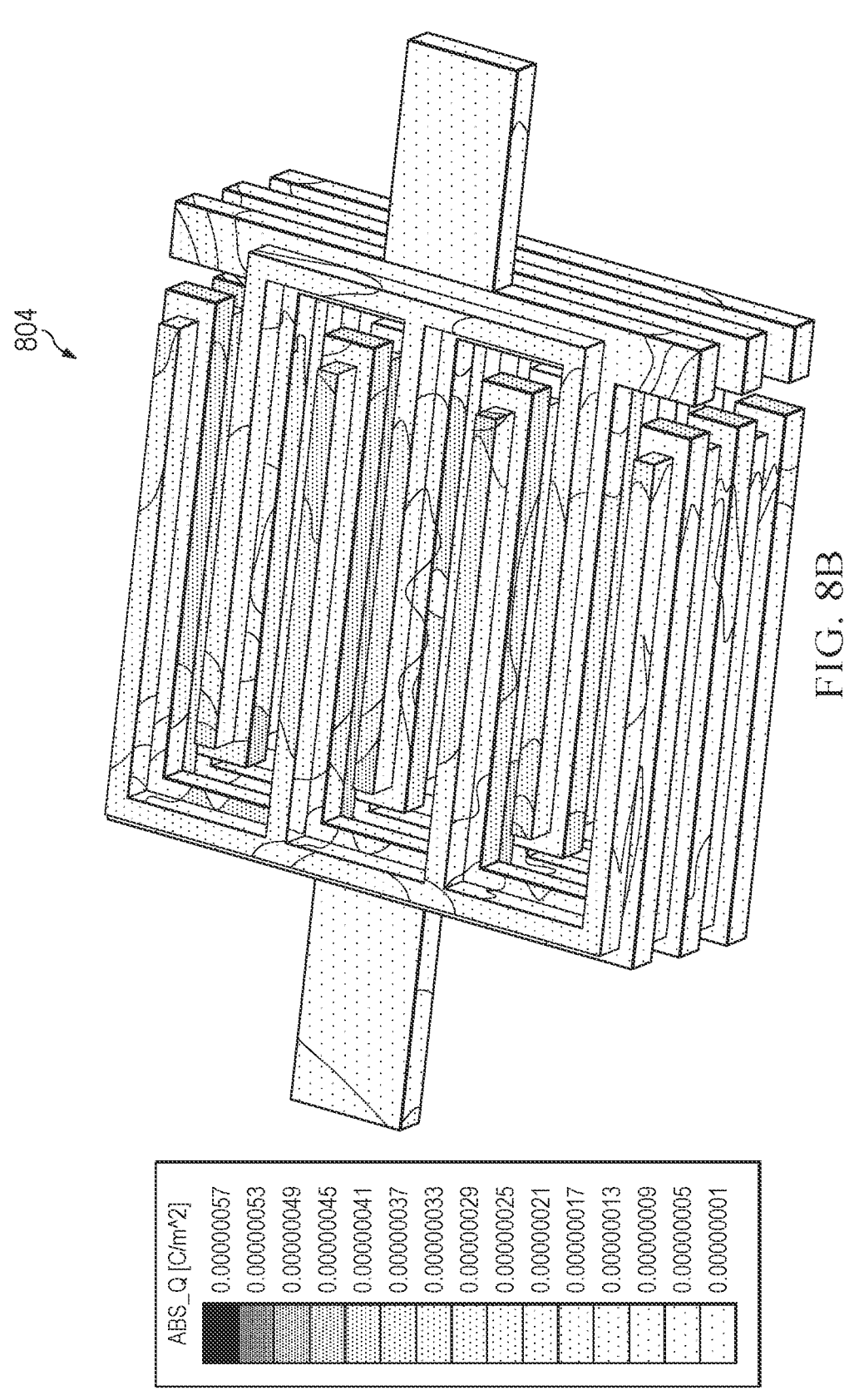
Figure 8C:
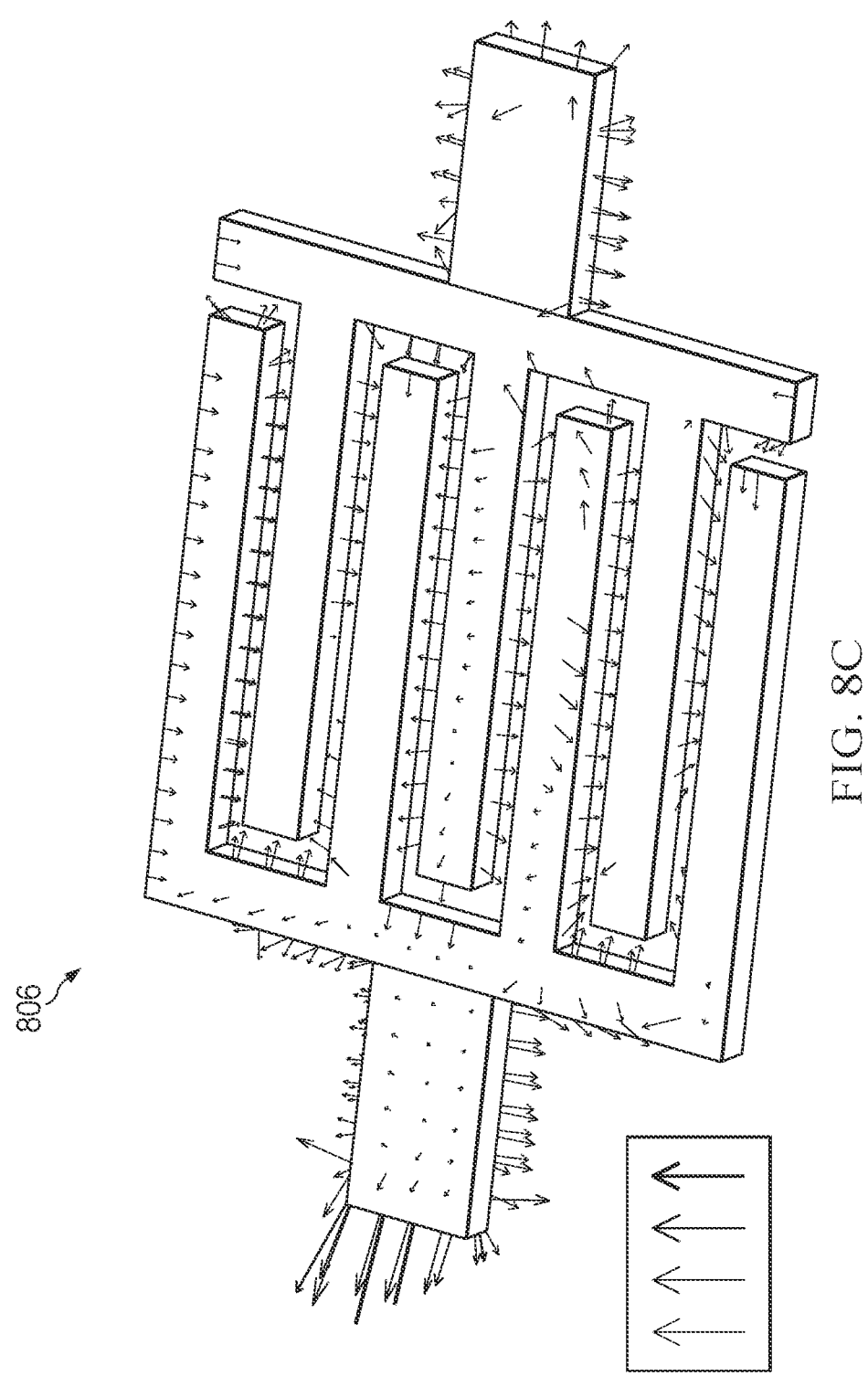
Figure 8D:
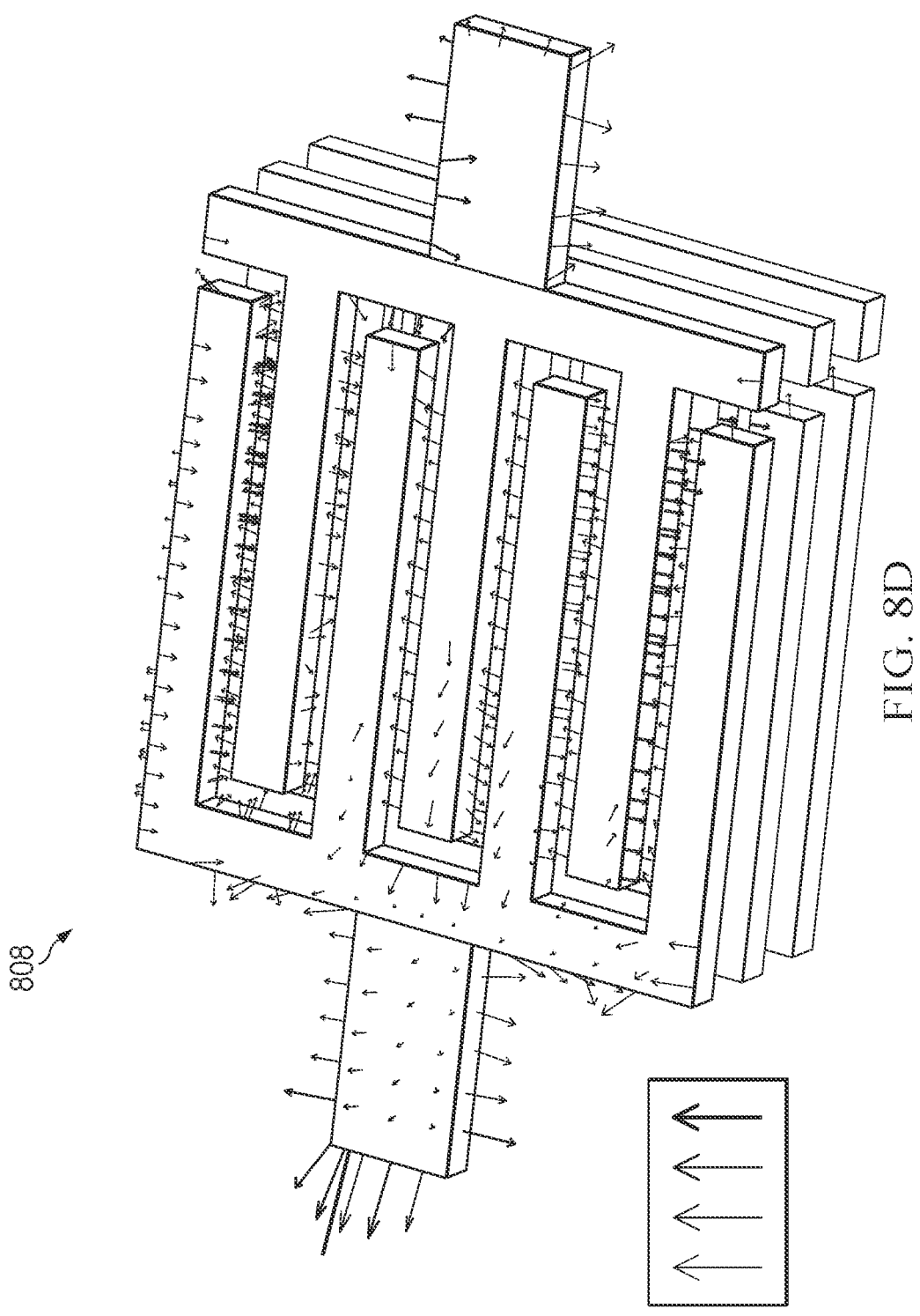

FIGS. 8A through 8D show a comparison of electrical properties of different IDCs. For example, FIGS. 8A and 8B compare electric field heat maps 802, 804, and FIGS. 8C and 8D compare electric field vector maps 806, 808, of example single-layer IDCs (maps 802 and 806 in FIGS. 8A and 8C, respectively) and multi-layer IDCs (maps 804 and 808 in FIGS. 8B and 8D, respectively). As shown in heat map 802 of FIG. 8A, the electric field of the single-layer IDC is distributed mainly in the fingers of the IDC, with "hot spots" of high electric field at the tips of the fingers. By comparison, as shown in heat map 804 of FIG. 8B, the electric field is more evenly distributed across the three-dimensional structure, a consequence of the electric field coupling at the multiple layers of the multi-layer IDC.

Figure 9:
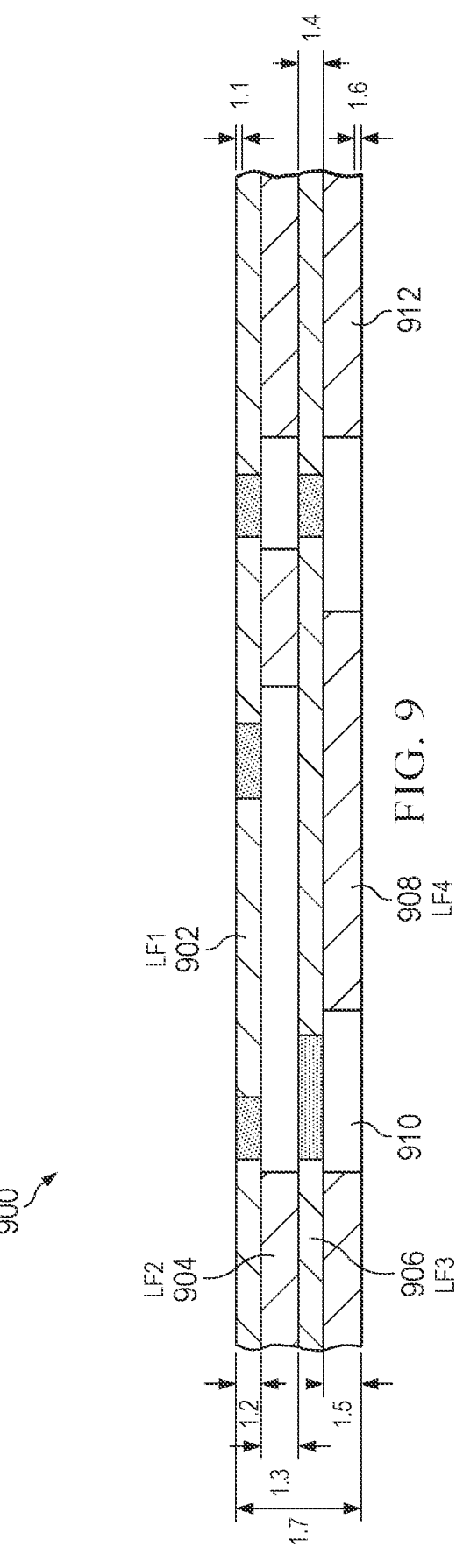
FIG. 9 is a cross-sectional diagram of an example multi-layer routable lead frame substrate in which an interdigital capacitor can be fabricated.

FIG. 9 shows a cross-section of an example multi-layer RLF substrate 900 in which an interdigital capacitor can be fabricated. By contrast to the three-layer IDC of FIGS. 2 and 3, FIG. 9 illustrates a two-layer substrate, having four distinct layers LF1 902, LF2 904, LF3 906, LF4 908 when counting the via layers LF1 902, LF3 906, which can correspond to layers LF1 through LF4 in FIGS. 3 and 5. Metal traces 910 (e.g., copper, aluminum, or gold) are surrounding by dielectric material 912 (e.g., ABF, a pre-preg material, or an epoxy). The traces and dielectric material are fabricated by building them up layer by layer in accordance with an RLF manufacturing process like that described above with regard to FIGS. 4A and 4B. Example thickness dimensions for the RLF substrate 900 are listed in Table 4.

TABLE 4

Example two-layer IDC thickness dimensions.

| | | | Example thicknesses (μm) | | |
|---|---|---|---|---|---|
| Index | Layer | Description | Minimum | Target | Maximum |
| 1.1 | LF1 | Trace1 etch back | 0 | — | 5 |
| 1.2 | LF1 | Trace1 thickness | 30 | 40 | 50 |
| 1.3 | LF2 | Via1 thickness | — | 65 | — |
| 1.4 | LF3 | Trace2 thickness | 30 | 40 | 50 |
| 1.5 | LF4 | Via2 thickness | — | 55 | — |
| 1.6 | LF4 | Via2 etch back | 0 | 5 | 10 |
| 1.7 | | Pre-mold thickness | 175 | 200 | 225 |

Figure 10A:
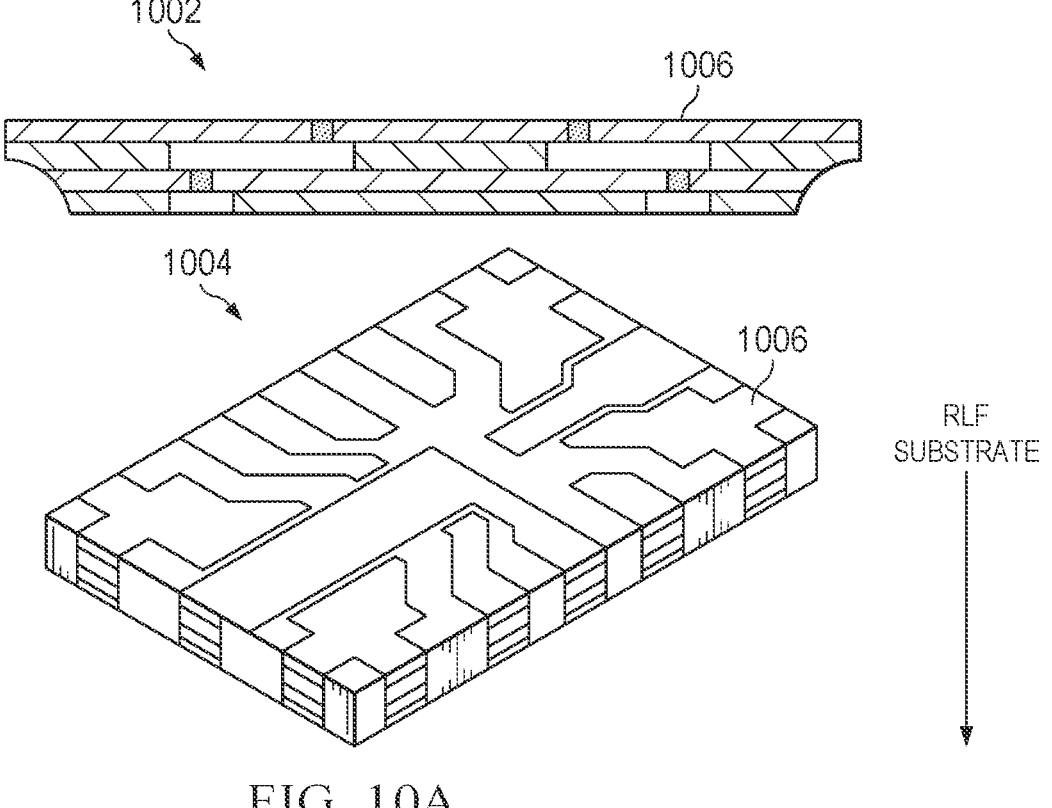
FIGS. 10A through 10C are diagrams showing cross-sectional and parallel projection views for an example fabrication flow of an integrated circuit package using a routable lead frame.
Figure 10B:
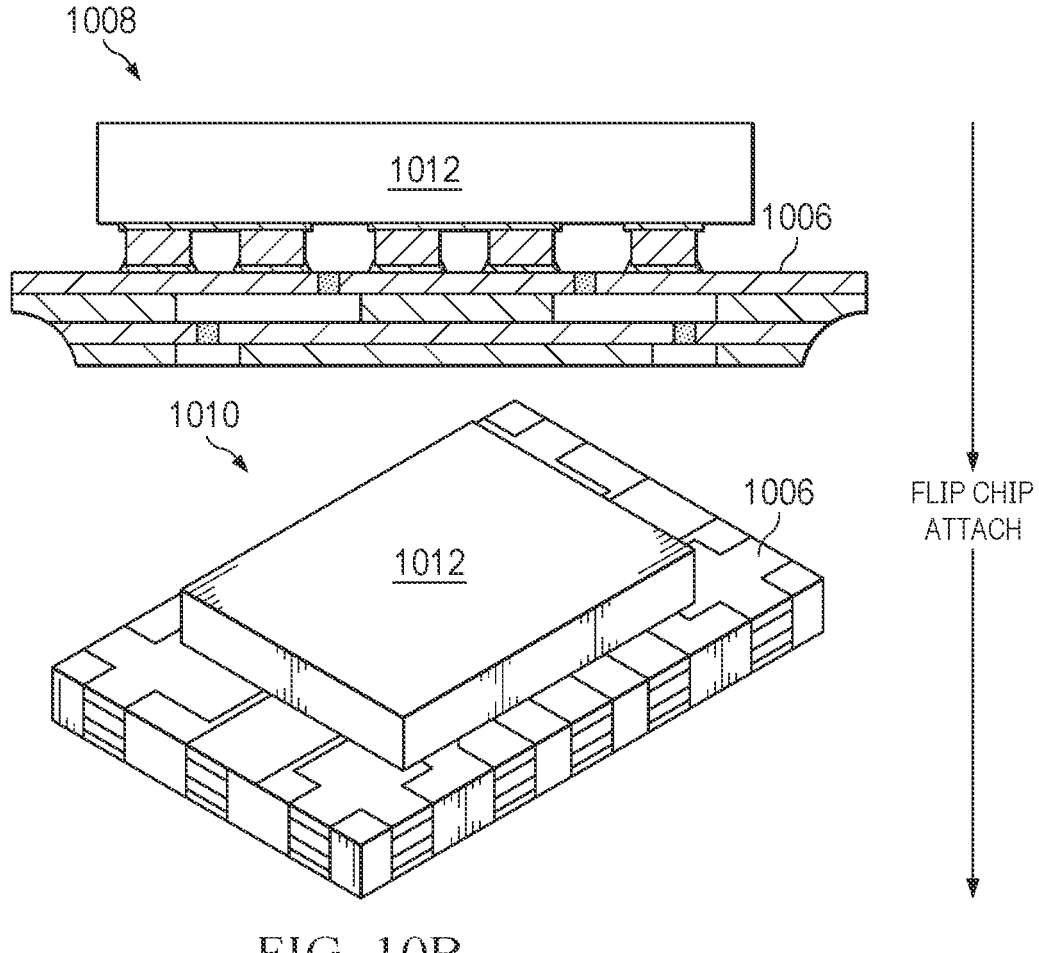
Figure 10C:
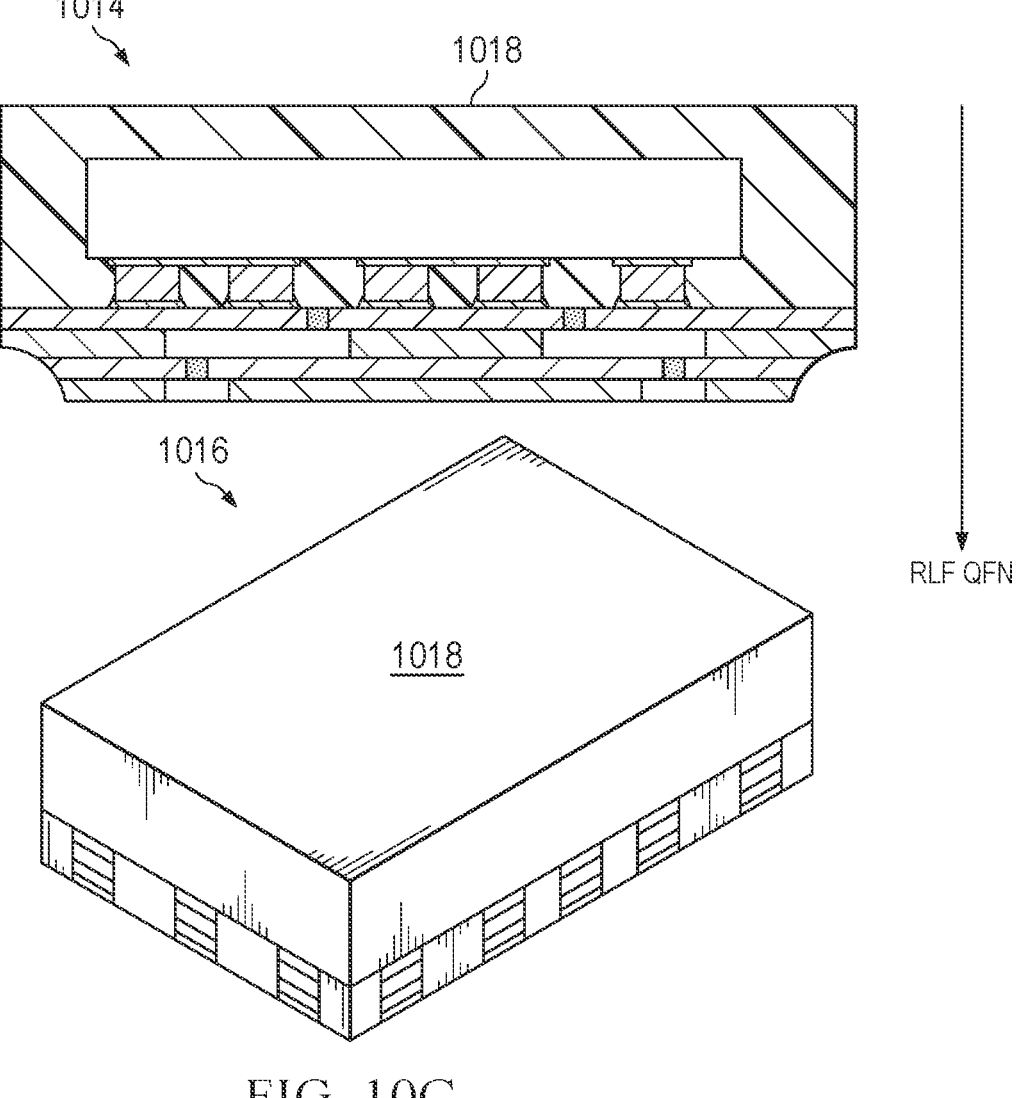

FIGS. 10A through 10C show an example fabrication flow of an integrated circuit package using a routable lead frame with cross-sectional views 1002, 1008, 1014 and corresponding parallel projection views 1004, 1010, 1016 of three portions of the packaging process. The RLF substrate 1006, as shown in views 1002 and 1004 of FIG. 10A, can be fabricated to include one or more IDCs (not shown in FIG. 10A). The RLF substrate 1006 can have been fabricated in accordance with an RLF manufacturing process like that described above with regard to FIG. 4. As shown in views 1008 and 1010 of FIG. 10B, one or more flip-chip dies, such as die 1012, can be attached to the RLF substrate 1006. In other examples, not illustrated, a die attached to the RLF substrate can be a wireable die rather than a flip-chip die. The illustrated RLF substrate 1006 is a two-layer substrate, but in other examples, the RLF substrate can have three or more layers, and in some examples, can be a substrate having an elevated trace, as shown in FIGS. 6E through 6G. In examples in which the RLF substrate is fabricated to have an elevated trace, any IDC having an elevated trace can be positioned outside of the die area (as shown in FIG. 6G). As shown in views 1014 and 1016 of FIG. 10C, an overmold process is performed to coat the top of the RLF substrate 1006 and the one or more dies 1012 with a molding compound and thus to create a packaged IC product 1018, e.g., as a quad flat no-lead (QFN) semiconductor package.

RLF IDCs as described above can be used in RF circuits as may be used in clock generation circuits, point-to-point radio circuits, circuits in military or space communications systems, circuits in very-small-aperture terminal (VSAT) transmit/receive stations, test signal generation circuits in electronic test equipment, and circuits used for millimeter-wave imaging. By combining RLF IDCs as described above with inductors, impedance-matching networks and filters can be created. High-speed multiplexer and radio frequency (RF) amplifier devices can use impedance tuning for a matching network. A high-speed multiplexer is a synthesizer that makes the frequency components and produces a signal of desired frequency content. An RF amplifier is high-frequency and requires impedance tuning to match the network and thus provide minimal signal loss. Capacitive and inductive tuning (L/C tuning) can be employed during a design phase of such circuits to provide the desired impedance matching.

When such L/C tuning is implemented on-chip (within an IC die), losses can be high, and capacitance values can be limited by chip size. High losses can be caused by low conductivity (high resistance) of the on-chip trace metal (usually aluminum) and the very small geometry of on-chip traces. The use of chip real estate to implement capacitors can also be high in cost. When such L/C tuning is implemented using an on-package SMT capacitor, extra cost and qualification processes are introduced by the additional steps in the packaging process that are incurred by the implementation of SMT capacitors. High-speed multiplexers and RF amplifiers that use an RLF packaging platform can benefit from RLF IDCs because the routability and any-shape via features of RLF fabrication processes permit the manufacture of a capacitor on-package. A multi-layer IDC structure using an any-shape via wall can be fabricated using RLF fabrication processes, but cannot be produced in laminated substrate fabrication processes. Multi-layer IDC structures also can have better performance than single-layer IDCs of the same area. The on-lead-frame IDCs as described herein thus can have cost and reliability advantages over one-chip or on-package SMT capacitors.

Figure 11:
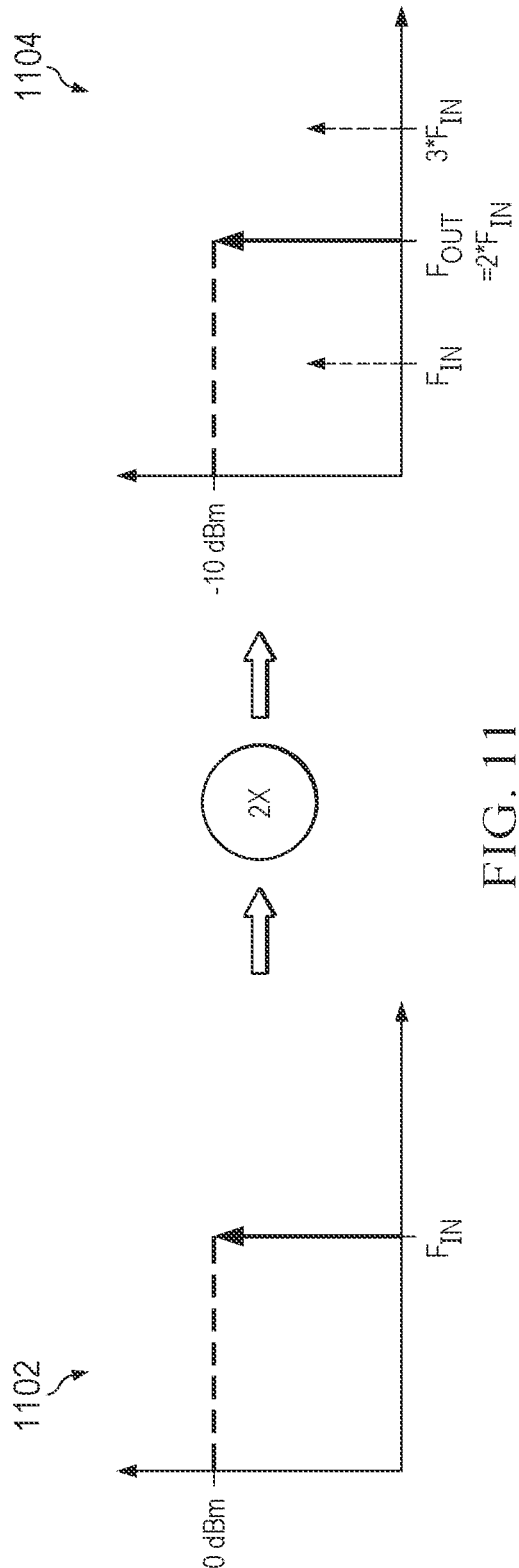
FIG. 11 is a diagram showing gain versus frequency plots for an example frequency multiplier that includes one or more routable lead frame interdigital capacitors as part of its impedance matching circuitry.
Figure 12:
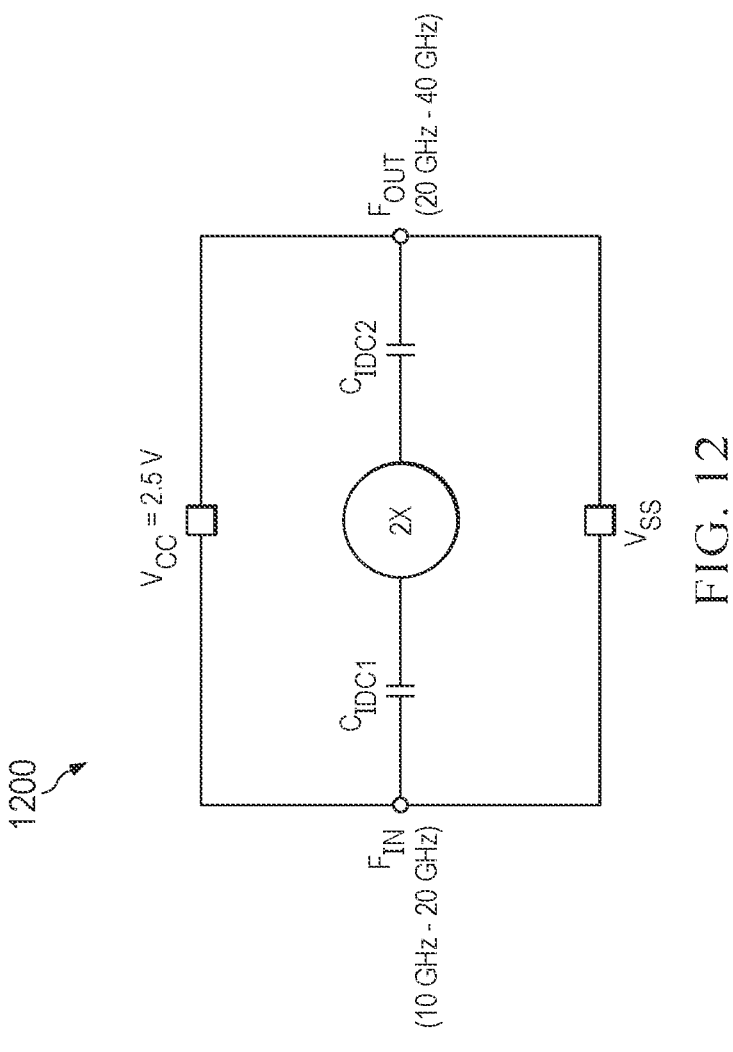
FIG. 12 is a block diagram of an example frequency multiplier that includes one or more routable lead frame interdigital capacitors as part of its impedance matching circuitry.
Figure 13:
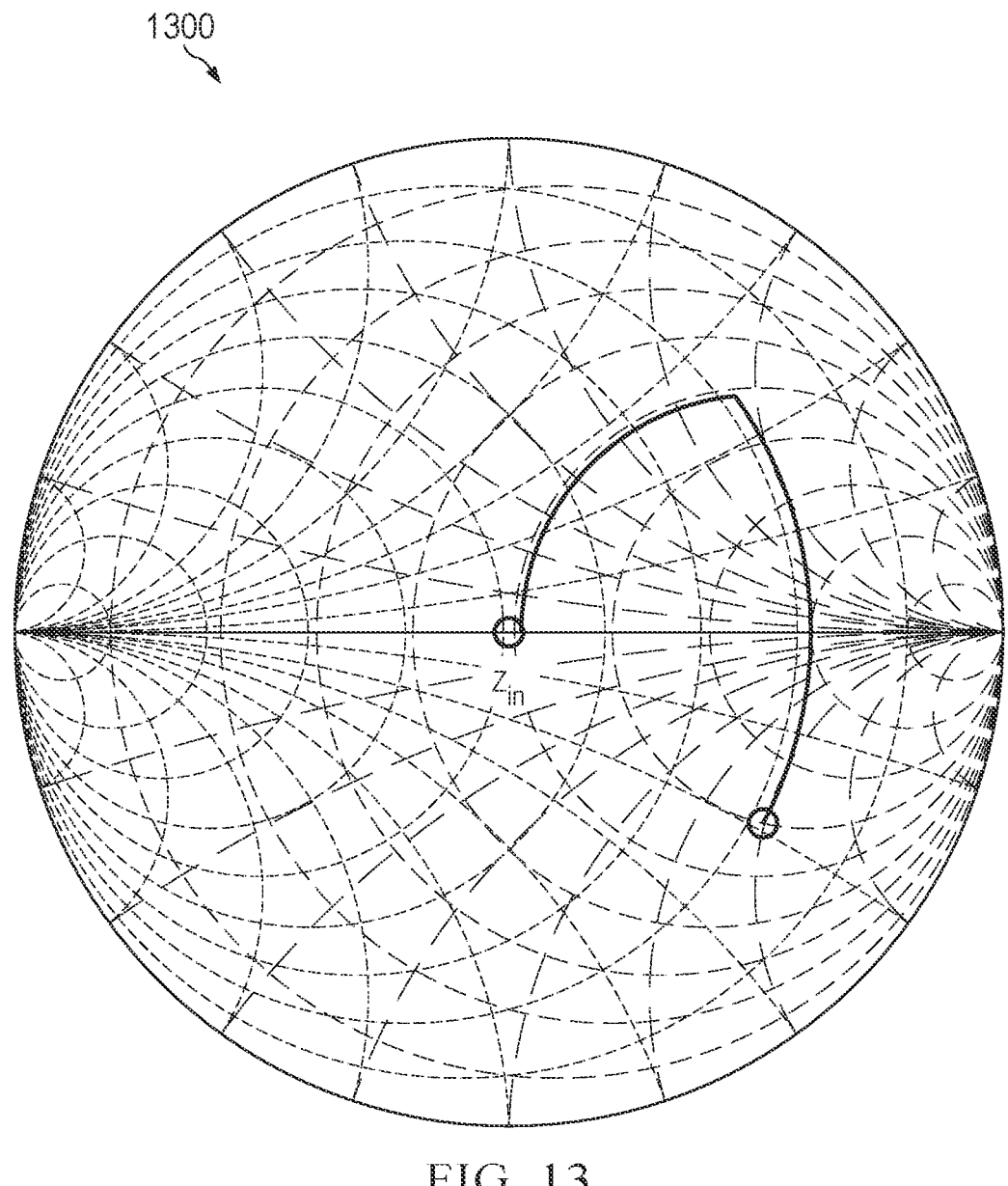
FIG. 13 is a Smith chart for an example frequency multiplier that includes one or more routable lead frame interdigital capacitors as part of its impedance matching circuitry.
Figure 14:
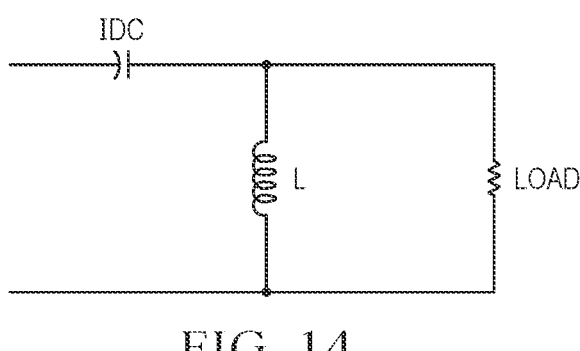
FIG. 14 is a circuit schematic of example L/C impedance matching circuitry.

FIG. 11 shows gain versus frequency plots 1102, 1004 for an example frequency multiplier or high-speed multiplexer that includes one or more RLF IDCs as part of its impedance matching circuitry. A block diagram 1200 of the example frequency multiplier is shown in FIG. 12, and a Smith chart 1300 of the example frequency multiplier is shown in FIG. 13. RLF IDCs as described above can be used to create the capacitors $C_{IDC1}$ and $C_{IDC2}$ in the example frequency multiplier, as shown in FIG. 12, and thus to achieve the frequency multiplication shown in FIG. 11. FIG. 14 shows example L/C impedance matching circuitry 1400. A transmission line uses L/C tuning to match input to load impedance. The capacitance of the transmission line can be provided by an RLF IDC, as described above, and thus to provide an integrated solution for achieving an RF frequency of interest.

Figure 15:
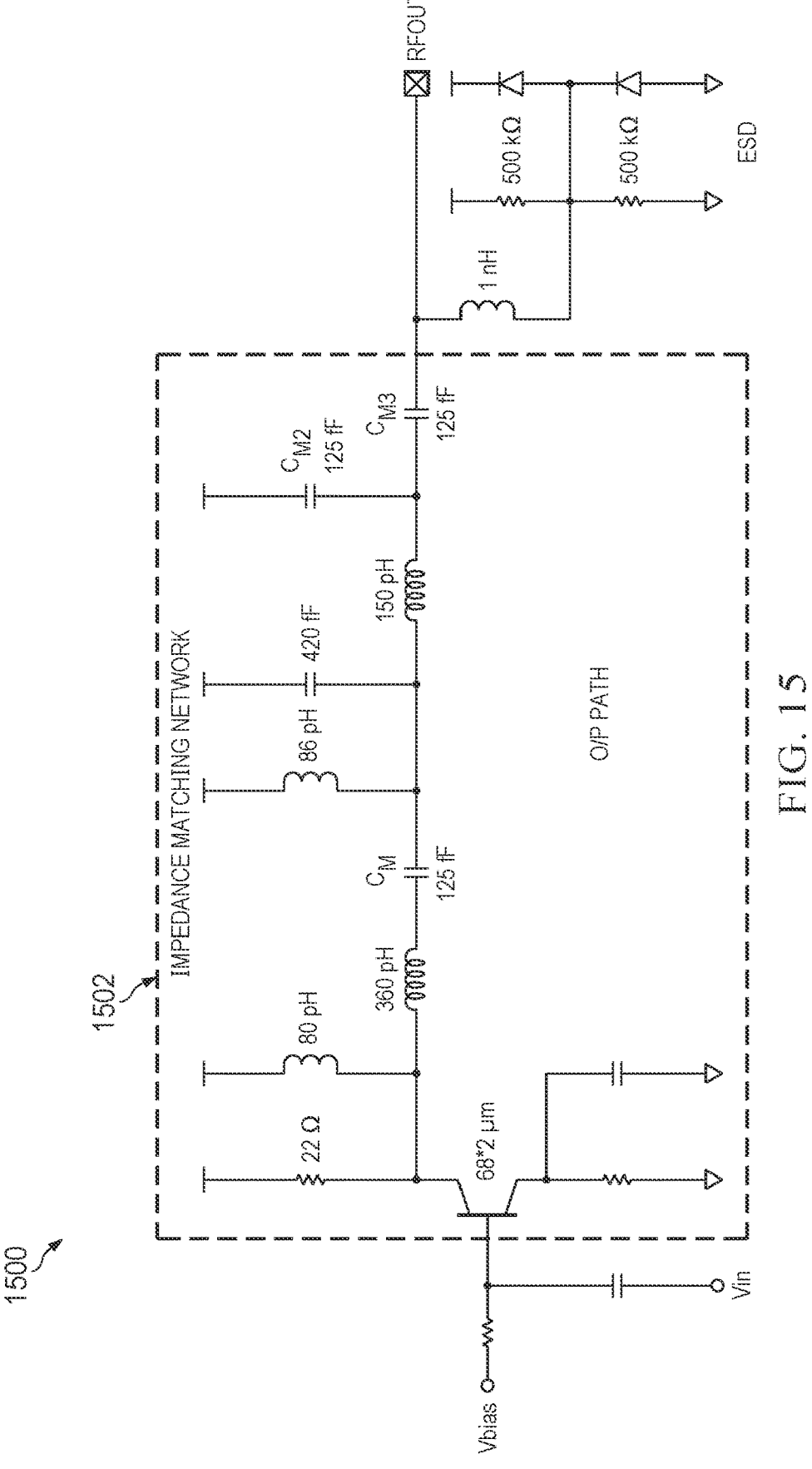
FIG. 15 is a circuit schematic of an example impedance matching network.

FIG. 15 shows an example impedance-matching network 1502 within RF circuitry portion 1500. Capacitors in the impedance-matching network, such as capacitors $C_{M1}$, $C_{M2}$, and $C_{M3}$ can be implemented using RLF IDCs as described above. The manufacture of one or more IDCs from passive traces on the package using an RLF packaging platform provides benefits and advantages discussed above.

FIG. 16 shows an example DC-to-DC converter input filter 1600 that includes one or more RLF IDCs (e.g., $IDC_1$, $IDC_2$) as part of its second-stage input filter circuitry 1608. DC-to-DC converter input filter 1600 has a two-stage input filter 1602 that includes first-stage input filter circuitry 1606 on a PCB and second-stage input filter circuitry 1608 on a package that is mounted to the PCB. A buck converter 1604 that can be implemented, e.g., on an IC die in the package, serves as a load to the input filter 1602. The RLF IDCs $IDC_1$, $IDC_2$ can be manufactured using an RLF fabrication process as described above.

The frequency response graph of FIG. 17 shows example frequency responses for an example DC-to-DC converter input filter that includes one or more RLF IDCs as part of its second-stage input filter circuitry, such as circuitry 1608 in FIG. 16. The RLF IDCs provide additional capacitance for the on-package second-stage filter, providing improved frequency response in loop gain and improved noise rejection in the mid-to-high frequency range.

The flow chart of FIG. 18 illustrates an example fabrication process 1800 for making an IDC in an RLF substrate. The IDC can be designed to have a desired number of layers. A metal carrier is provided 1802 as a base layer. The carrier, which can be as shown in view 402 in FIG. 4A, can be, for example, stainless steel. A first IDC layer, including conductive IDC fingers, is formed 1804 by pattern plating a conductive (e.g., metal) layer on the carrier, as shown, for example, in view 406 of FIG. 4. The first IDC layer can be, for example, copper, aluminum, or gold. The forming the first IDC layer on the carrier can include, for example, patterning and developing a first photoresist material layer (e.g., a photolithographic mask) on the carrier to expose first openings in the first photoresist material layer, forming (e.g., electroplating) a pattern (including, e.g., IDC fingers and/or terminals) on the carrier in the first openings of the first photoresist material layer, and stripping the first photoresist material layer via a first etching process. The pattern of the first IDC layer can, for example, be formed (e.g., electroplated) to a thickness as given in Table 2 or Table 4.

A second IDC layer is formed 1806 as an any-shape via layer by pattern plating a conductive (e.g., metal) layer over and within two-dimensional contours of the first IDC layer, as shown, for example, in view 410 of FIG. 4A. The any-shape via layer is not limited to circular or low-aspect-ratio vias or arrays of such vias, but can be of any shape, including a fingered comb shape, provided it remains within the two-dimensional contours of the first IDC layer (as viewed in a top-down view). The second IDC layer can be, for example, copper, aluminum, or gold. The forming the second IDC layer can include, for example, patterning and developing a second photoresist material layer on the carrier and over portions of the first IDC layer to expose second openings in the second photoresist material layer, and forming (e.g., electroplating) the second IDC layer on the first IDC layer in the second openings of the second photoresist material layer. The second photoresist material layer can then be stripped via a second etching process. The pattern of the second IDC layer can, for example, be formed (e.g., electroplated) to a thickness as given in Table 2 or Table 4.

First molding is then formed 1808 over the first and second IDC layers, as shown, for example, in view 414 of FIG. 4A. The material of the molding can be a high-k dielectric material, e.g., ABF, a pre-preg material, or an epoxy. For example, the first molding can be formed by compression molding. The first molding is then ground 1810 to expose a surface of the second IDC layer, as shown, for example, in view 418 of FIG. 4A.

If 1812 the IDC is desired to have only the first and second IDC layers (the second IDC layer being a via layer), then the metal carrier can be removed 1814, as shown, for example, in view 420 of FIG. 4A. This de-carrier 1814 can be carried out, for example, by dislodging the carrier from the first molding and the first and second IDC layers via a combination of a chemical etch process and a mechanical process. The first molding and the first and second IDC layers remain intact with each other and form the desired RLF IDC, which can subsequently be attached to a die, as shown in FIG. 10B. If, however, the IDC is desired to have a greater number of IDC layers, then actions 1804 through 1810 can be repeated as many times as desired to form an RLF substrate of the desired number of layers. For example, the forming of the IDC layers 1804, 1806 can be repeated to form third and fourth IDC layers (the fourth IDC layer being an any-shape via layer), as shown views 456, 460 of FIG. 4B, and a second molding can be formed 1808 and ground 1810 to expose a surface of the fourth IDC layer, as shown in views 464, 468 of FIG. 4B. Then, either a de-carrier process 1814 can then be carried out, as shown in view 470 of FIG. 4B, or actions 1804 through 1810 can be repeated once more, followed by a de-carrier 470, to result in an RLF IDC structure like that shown in FIG. 2. Actions 1804 through 1810 can be repeated an additional number of times commensurate with the desired number of layers. Successively plated layers can be of the same thickness or of different thicknesses.

Multi-layer RLF IDCs demonstrate an improvement in capacitance value over single-layer IDCs or multi-layer IDCs made with other processes because of the capacitive coupling at multiple layers and because of the availability in RLF fabrication processes of an any-shape via. Elevated traces, as available only in RLF fabrication processes, can provide additional capacitive coupling and increase the value of IDC capacitance even more. RLF IDCs further have the benefit of no additional SMT cost. RLF IDCs demonstrate improved quality factor for ESL and ESR as compared to single-layer IDCs. In contrast to on-package SMT capacitors or on-chip capacitors, RLF IDCs do not impose additional cost and manufacturing risk when used for packages that already utilize RLF fabrication for the lead frame substrate.

In this description, the term "based on" means based at least in part on. Also, in this description, the term "couple" or "couples" means either an indirect or direct wired or wireless connection. Thus, if a first device, element, or component couples to a second device, element, or component, that coupling may be through a direct coupling or through an indirect coupling via other devices, elements, or components and connections. Similarly, a device, element, or component that is coupled between a first component or location and a second component or location may be through a direct connection or through an indirect connection via other devices, elements, or components and/or couplings.

Modifications are possible in the described embodiments, and other embodiments are possible, within the scope of the claims.

What is claimed is:

1. A substrate, comprising:
a conductive layer having a first trace comprising first fingers and a second trace comprising second fingers, the first fingers interdigitated with the second fingers;
a via layer over the conductive layer, the via layer comprising a first conductive via conductively coupled to the first trace and a second conductive via conductively coupled to the second trace;
dielectric material disposed between the first trace and the second trace and between the first conductive via and the second conductive via; and
a first terminal conductively coupled to the first trace,
wherein the first conductive via comprises a comb shape and the first terminal does not comprise a comb shape.

2. The substrate of claim 1, wherein the conductive layer and the via layer comprise copper, and the dielectric material comprises Ajinomoto Build-up Film (ABF).

3. The substrate of claim 1, wherein the conductive layer is a first conductive layer, the via layer is a first via layer, and the dielectric material is first dielectric material, the substrate further comprising:
a second conductive layer having a third trace comprising third fingers and a fourth trace comprising fourth fingers, the third fingers interdigitated with the fourth fingers, the third trace disposed over and conductively coupled to the first conductive via, the fourth trace disposed over and conductively coupled to the second conductive via;
a second via layer over the second conductive layer, a third conductive via of the second via layer conductively coupled to the third trace, a fourth conductive via of the second via layer conductively coupled to the fourth trace; and
second dielectric material disposed between the third trace and the fourth trace and between the third conductive via and the fourth conductive via.

4. The substrate of claim 3, wherein:
the first conductive via comprises fifth fingers,
the second conductive via comprises sixth fingers,
a finger of the third fingers is over and in conductive contact with a respective finger of the first fingers via a respective finger of the fifth fingers, and
a finger of the fourth fingers is over and in conductive contact with a respective finger of the second fingers via a respective finger of the sixth fingers.

5. The substrate of claim 3, further comprising:
a third conductive layer having a fifth trace comprising fifth fingers and a sixth trace comprising sixth fingers, the fifth fingers interdigitated with the sixth fingers, the fifth trace disposed over and conductively coupled to the third conductive via, the sixth trace disposed over and conductively coupled to the fourth conductive via; and
third dielectric material disposed between the fifth trace and the sixth trace.

6. The substrate of claim 5, wherein:
the third conductive via comprises seventh fingers,
the fourth conductive via comprises eighth fingers,
a finger of the fifth fingers is over and in conductive contact with a respective finger of the third fingers via a respective finger of the seventh fingers, and a finger of the sixth fingers is over and in conductive contact with a respective finger of the fourth fingers via a respective finger of the eighth fingers.

7. The substrate of claim 5, further comprising:

a third via layer over the third conductive layer, the third via layer comprising a fifth conductive via and a sixth conductive via, the fifth conductive via conductively coupled to the fifth trace, the sixth conductive via conductively coupled to the sixth trace.

8. The substrate of claim 7, wherein the third dielectric material is also disposed between the fifth conductive via and the sixth conductive via.

9. The substrate of claim 7, wherein the third via layer extends above, and is entirely unencapsulated by the third dielectric material.

10. An integrated circuit (IC), comprising:

a substrate;

an IC die attached and conductively coupled to an upper surface of the substrate; and a mold encapsulating the IC die and the upper surface of the substrate, wherein the substrate comprises:

a conductive layer having a first trace comprising first fingers and a second trace comprising second fingers, the first fingers interdigitated with the second fingers;

a via layer over the conductive layer, the via layer comprising a first conductive via conductively coupled to the first trace and a second conductive via conductively coupled to the second trace;

dielectric material disposed between the first trace and the second trace and between the first conductive via and the second conductive via; and a first terminal conductively coupled to the first trace, wherein the first conductive via comprises a comb shape and the first terminal does not comprise a comb shape.

11. The IC of claim 10, wherein the substrate further comprises:

a second conductive layer having a third trace comprising third fingers and a fourth trace comprising fourth fingers, the third fingers interdigitated with the fourth fingers, the third trace disposed over and conductively coupled to the first conductive via, the fourth trace disposed over and conductively coupled to the second conductive via.

12. The IC of claim 11, wherein the substrate further comprises:

a third conductive layer having a fifth trace comprising fifth fingers and a sixth trace comprising sixth fingers, the fifth fingers interdigitated with the sixth fingers; and a second via layer disposed between the second conductive layer and the third conductive layer, the second via layer comprising:

a third conductive via conductively coupling the third trace with the fifth trace; and a fourth conductive via conductively coupling the fourth trace with the sixth trace.

13. The IC of claim 10, wherein the conductive layer and the via layer comprise copper, and the dielectric material comprises Ajinomoto Build-up Film (ABF).

14. The IC of claim 12, wherein the substrate further comprises:

a third via layer over the third conductive layer, the third via layer comprising a fifth conductive via and a sixth conductive via, the fifth conductive via conductively coupled to the fifth trace, the sixth conductive via conductively coupled to the sixth trace.

15. The IC of claim 14, wherein the third via layer extends above, and is entirely unencapsulated by the dielectric material.

* * * * *